(12) United States Patent
Ryshtun et al.

(10) Patent No.: US 9,442,144 B1
(45) Date of Patent: Sep. 13, 2016

(54) CAPACITIVE FIELD SENSOR WITH SIGMA-DELTA MODULATOR

(71) Applicant: Cypress Semiconductor Corporation, San Jose, CA (US)

(72) Inventors: Andriy Ryshtun, Lviv (UA); Victor Kremin, Lviv (UA)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 14/058,464

(22) Filed: Oct. 21, 2013

Related U.S. Application Data

(63) Continuation of application No. 13/612,803, filed on Sep. 12, 2012, now Pat. No. 8,564,313, which is a continuation of application No. 12/380,141, filed on Feb. 23, 2009, now Pat. No. 8,570,053, which is a continuation-in-part of application No. 12/167,100, filed on Jul. 2, 2008, now Pat. No. 8,089,289.

(60) Provisional application No. 61/030,526, filed on Feb. 21, 2008, provisional application No. 60/947,865, filed on Jul. 3, 2007.

(51) Int. Cl.
*G01R 27/26* (2006.01)

(52) U.S. Cl.
CPC .................. *G01R 27/2605* (2013.01)

(58) Field of Classification Search
CPC . G01D 5/24; G01R 27/2605; G01R 31/2829
USPC .................................................. 324/679–688
See application file for complete search history.

(56) References Cited

U.S. PATENT DOCUMENTS

| | | |
|---|---|---|
| 3,611,024 A | 10/1971 | Nakatsu et al. |
| 3,660,801 A | 5/1972 | Paulfus |
| 4,277,783 A | 7/1981 | Sampieri et al. |
| 4,510,466 A * | 4/1985 | Chang et al. ................. 332/116 |
| 4,558,274 A | 12/1985 | Carusillo |
| 4,686,332 A | 8/1987 | Greanias et al. |
| 4,878,013 A | 10/1989 | Andermo |
| 4,896,156 A | 1/1990 | Garverick |
| 4,977,480 A | 12/1990 | Nishihara |
| 5,122,755 A | 6/1992 | Nootbaar et al. |
| 5,365,461 A | 11/1994 | Stein et al. |
| 5,386,584 A | 1/1995 | Verstegen et al. |
| 5,412,387 A | 5/1995 | Vincelette et al. |
| 5,461,321 A | 10/1995 | Sanders et al. |
| 5,479,103 A | 12/1995 | Kernahan et al. |

(Continued)

OTHER PUBLICATIONS

U.S. Appl. No. 13/342,942, "Capacitive Field Sensor With Sigma-Delta Modulator" filed Jan. 3, 2012; 41 pages.

(Continued)

*Primary Examiner* — Vincent Q Nguyen

(57) ABSTRACT

A capacitive sensor includes a switching capacitor circuit, a comparator, and a charge dissipation circuit. The switching capacitor circuit reciprocally couples a sensing capacitor in series with a modulation capacitor during a first switching phase and discharges the sensing capacitor during a second switching phase. The comparator is coupled to compare a voltage potential on the modulation capacitor to a reference and to generate a modulation signal in response. The charge dissipation circuit is coupled to the modulation capacitor to selectively discharge the modulation capacitor in response to the modulation signal.

20 Claims, 17 Drawing Sheets

(56) References Cited

U.S. PATENT DOCUMENTS

| | | |
|---|---|---|
| 5,495,077 A | 2/1996 | Miller et al. |
| 5,525,980 A | 6/1996 | Jahier et al. |
| 5,730,165 A | 3/1998 | Philipp |
| 5,841,078 A | 11/1998 | Miller et al. |
| 5,872,561 A | 2/1999 | Figie et al. |
| 5,949,264 A | 9/1999 | Lo |
| 6,008,660 A | 12/1999 | Mahlbacher |
| 6,140,853 A | 10/2000 | Lo |
| 6,278,283 B1 | 8/2001 | Tsugai |
| 6,400,217 B1 | 6/2002 | Bhandari |
| 6,448,792 B1 | 9/2002 | Yoshida et al. |
| 6,449,195 B1 | 9/2002 | Min et al. |
| 6,466,036 B1 | 10/2002 | Philipp |
| 6,529,015 B2 | 3/2003 | Nonoyama et al. |
| 6,690,066 B1 | 2/2004 | Lin et al. |
| 6,731,121 B1 | 5/2004 | Hsu et al. |
| 6,744,258 B2 | 6/2004 | Ishio et al. |
| 6,753,801 B2 | 6/2004 | Rossi |
| 6,768,420 B2 | 7/2004 | McCarthy et al. |
| 6,859,159 B2 | 2/2005 | Michalski |
| 6,897,673 B2 | 5/2005 | Savage et al. |
| 6,940,291 B1 | 9/2005 | Ozick |
| 6,949,937 B2 | 9/2005 | Knoedgen |
| 7,006,938 B2 | 2/2006 | Laraia et al. |
| 7,075,864 B2 | 7/2006 | Kakitsuka et al. |
| 7,129,714 B2 | 10/2006 | Baxter |
| 7,205,777 B2 | 4/2007 | Schulz et al. |
| 7,245,131 B2 | 7/2007 | Kurachi et al. |
| 7,271,608 B1 | 9/2007 | Vermeire et al. |
| 7,301,350 B2 | 11/2007 | Hargreaves et al. |
| 7,378,810 B1 | 5/2008 | Sutardja et al. |
| 7,406,393 B2 | 7/2008 | Ely et al. |
| 7,428,191 B1 | 9/2008 | Klein |
| 7,504,833 B1 | 3/2009 | Seguine |
| 7,598,752 B2 | 10/2009 | Li |
| 7,667,468 B1 | 2/2010 | Anderson |
| 7,804,307 B1 | 9/2010 | Bokma et al. |
| 7,982,723 B2 | 7/2011 | Ningrat |
| 8,040,142 B1 | 10/2011 | Bokma et al. |
| 8,068,097 B2 | 11/2011 | GuangHai |
| 8,082,566 B2 | 12/2011 | Stallings |
| 8,089,288 B1 | 1/2012 | Maharita |
| 8,089,289 B1 | 1/2012 | Kremin et al. |
| 8,093,914 B2 | 1/2012 | Maharyta et al. |
| 8,169,238 B1 | 5/2012 | Maharyta et al. |
| 8,242,788 B2 | 8/2012 | Hsu et al. |
| 8,248,084 B2 | 8/2012 | Bokma et al. |
| 8,436,263 B2 | 5/2013 | Kremin |
| 8,547,114 B2 | 10/2013 | Kremin |
| 8,570,053 B1 | 10/2013 | Ryshtun et al. |
| 9,013,429 B1 | 4/2015 | Krekhovetskyy et al. |
| 9,069,405 B2 | 6/2015 | Grivna et al. |
| 2001/0048313 A1 | 12/2001 | Frank |
| 2002/0008543 A1 | 1/2002 | Nasu et al. |
| 2002/0080014 A1 | 6/2002 | McCarthy et al. |
| 2003/0058053 A1 | 3/2003 | Jeon et al. |
| 2003/0112021 A1 | 6/2003 | Palata et al. |
| 2003/0161278 A1 | 8/2003 | Igura |
| 2003/0184065 A1 | 10/2003 | Breed et al. |
| 2003/0189419 A1 | 10/2003 | Maki et al. |
| 2003/0209893 A1 | 11/2003 | Breed et al. |
| 2004/0039298 A1 | 2/2004 | Abreu |
| 2004/0047110 A1 | 3/2004 | Friederich et al. |
| 2004/0129478 A1 | 7/2004 | Breed et al. |
| 2004/0173028 A1 | 9/2004 | Rix |
| 2004/0183560 A1 | 9/2004 | Savage et al. |
| 2004/0209591 A1 | 10/2004 | Martin et al. |
| 2005/0099188 A1 | 5/2005 | Baxter |
| 2005/0283330 A1 | 12/2005 | Laraia et al. |
| 2006/0012580 A1 | 1/2006 | Perski et al. |
| 2006/0012581 A1 | 1/2006 | Haim et al. |
| 2006/0022660 A1 | 2/2006 | Itoh |
| 2006/0033508 A1 | 2/2006 | Lee |
| 2006/0066585 A1 | 3/2006 | Lin |
| 2006/0119331 A1 | 6/2006 | Jacobs et al. |
| 2006/0132111 A1 | 6/2006 | Jacobs et al. |
| 2006/0176718 A1 | 8/2006 | Itoh |
| 2006/0193156 A1 | 8/2006 | Kaishita et al. |
| 2006/0197752 A1 | 9/2006 | Hurst et al. |
| 2006/0267953 A1 | 11/2006 | Peterson et al. |
| 2007/0046299 A1 | 3/2007 | Hargreaves et al. |
| 2007/0100566 A1 | 5/2007 | Coley |
| 2007/0152977 A1 | 7/2007 | Ng et al. |
| 2007/0164756 A1 | 7/2007 | Lee |
| 2007/0173220 A1 | 7/2007 | Kim et al. |
| 2007/0176609 A1 | 8/2007 | Ely et al. |
| 2007/0229468 A1 | 10/2007 | Peng et al. |
| 2007/0257894 A1 | 11/2007 | Philipp |
| 2007/0263191 A1 | 11/2007 | Shibazaki |
| 2007/0268243 A1 | 11/2007 | Choo et al. |
| 2007/0296709 A1 | 12/2007 | GuangHai |
| 2008/0007529 A1 | 1/2008 | Paun et al. |
| 2008/0007534 A1 | 1/2008 | Peng et al. |
| 2008/0048997 A1 | 2/2008 | Gillespie et al. |
| 2008/0100280 A1 | 5/2008 | Masson et al. |
| 2008/0111714 A1 | 5/2008 | Kremin |
| 2008/0150906 A1 | 6/2008 | Grivna |
| 2008/0250864 A1 | 10/2008 | Shipton |
| 2008/0277171 A1 | 11/2008 | Wright |
| 2009/0096757 A1 | 4/2009 | Hotelling et al. |
| 2009/0128516 A1 | 5/2009 | Rimon et al. |
| 2009/0160787 A1 | 6/2009 | Westerman et al. |
| 2009/0284495 A1 | 11/2009 | Geaghan et al. |
| 2009/0322351 A1 | 12/2009 | McLeod |
| 2010/0006350 A1 | 1/2010 | Elias |
| 2010/0007631 A1 | 1/2010 | Chang |
| 2010/0013791 A1 | 1/2010 | Haga et al. |
| 2010/0039405 A1 | 2/2010 | Chen et al. |
| 2010/0073301 A1 | 3/2010 | Yousefpor et al. |
| 2010/0097328 A1 | 4/2010 | Simmons et al. |
| 2010/0098257 A1 | 4/2010 | Mueller |
| 2010/0155153 A1 | 6/2010 | Zachut |
| 2010/0328256 A1 | 12/2010 | Harada et al. |
| 2011/0025629 A1 | 2/2011 | Grivna et al. |
| 2011/0156724 A1 | 6/2011 | Bokma et al. |
| 2012/0327041 A1 | 12/2012 | Harley et al. |
| 2013/0162585 A1 | 6/2013 | Schwartz |
| 2013/0207906 A1 | 8/2013 | Yousefpor et al. |

OTHER PUBLICATIONS

USPTO Non-Final Rejection for U.S. Appl. No. 12/380,141, dated Jan. 29, 2013; 6 pages.
USPTO Non-Final Rejection for U.S. Appl. No. 12/380,141, dated Sep. 19, 2011; 6 pages.
USPTO Non-Final Rejection for U.S. Appl. No. 13/612,803, dated Feb. 5, 2013; 7 pages.
USPTO Notice of Allowance for U.S. Appl. No. 12/380,141, dated Jan. 26, 2012; 7 pages.
USPTO Notice of Allowance for U.S. Appl. No. 12/380,141, dated Apr. 10, 2012; 7 pages.
USPTO Notice of Allowance for U.S. Appl. No. 12/380,141, dated May 15, 2012; 7 pages.
USPTO Notice of Allowance for U.S. Appl. No. 12/380,141, dated Jun. 14, 2012; 8 pages.
USPTO Notice of Allowance for U.S. Appl. No. 12/380,141, dated Jul. 31, 2012; 5 pages.
USPTO Notice of Allowance for U.S. Appl. No. 12/380,141, dated Aug. 6, 2013; 9 pages.
U.S. Appl. No. 13/191,806: "Capacitance Measurement Systems and Methods", filed Jul. 27, 2011, 38 pages.
U.S. Appl. No. 13/360,296: "Multiplexer for a TX/RX Capacitance Sensing Panel" Edward Grivna et al., filed on Jan. 27, 2012; 101 pages.
U.S. Appl. No. 13/741,090: "Multi-Stage Stylus Scanning," Ruslan Omelchuk, filed on Jan. 14, 2013; 58 pages.
International Search Report for International Application No. PCT/US08/13622 dated Feb. 9, 2009; 2 pages.
KIPO Office Action for Application No. 10-2010-7015566 dated Oct. 6, 2014, 4 pages.
Microchip Technology Inc., Document No. DS31002S, 1997 Microchip Technology, Inc., p. 2-13.

(56) References Cited

OTHER PUBLICATIONS

SIPO 1st Office Action for Application No. 200880120802.9 dated Nov. 5, 2012; 6 pages.
SIPO 2nd Office Action for Application No. 200880120802.9 dated Jul. 9, 2013; 4 pages.
SIPO Office Action for Application No. 200880120802.9 dated Jul. 18, 2014; 3 pages.
SIPO Office Action for Application No. 200880120802.9 dated Dec. 13, 2013; 5 pages.
TIPO Office Action for Application No. 097148538 dated Jul. 14, 2014; 4 pages.
TIPO Office Action for Application No. 097148538 dated Nov. 21, 2013; 2 pages.
USPTO Advisory Action for U.S. Appl. No. 12/332,980 dated Aug. 9, 2011; 3 pages.
USPTO Advisory Action for U.S. Appl. No. 12/844,798 dated May 9, 2013; 3 pages.
USPTO Advisory Action for U.S. Appl. No. 12/844,798 dated Aug. 23, 2012; 3 pages.
USPTO Advisory Action for U.S. Appl. No. 12/844,798 dated Dec. 30, 2013; 3 pages.
USPTO Advisory Action for U.S. Appl. No. 12/844,798 dated Apr. 10, 2013, 3 pages.
USPTO Final Rejection for U.S. Appl. No. 11/601,465 dated Mar. 6, 2009; 11 pages.
USPTO Final Rejection for U.S. Appl. No. 11/601,465 dated Jul. 9, 2008; 10 pages.
USPTO Final Rejection for U.S. Appl. No. 11/729,818 dated Jul. 2, 2009; 14 pages.
USPTO Final Rejection for U.S. Appl. No. 11/824,249 dated Dec. 22, 2011; 10 pages.
USPTO Final Rejection for U.S. Appl. No. 12/332,980 dated May 31, 2011; 11 pages.
USPTO Final Rejection for U.S. Appl. No. 12/844,798 dated Feb. 13, 2013; 19 pages.
USPTO Final Rejection for U.S. Appl. No. 12/844,798 dated Oct. 7, 2013; 24 pages.
USPTO Final Rejection for U.S. Appl. No. 12/844,798 dated Jun. 18, 2012, 21 pages.
USPTO Final Rejection for U.S. Appl. No. 12/861,812 dated Oct. 18, 2011; 10 pages.
USPTO Final Rejection for U.S. Appl. No. 13/590,390 dated Jun. 23, 2015; 14 pages.
USPTO Final Rejection for U.S. Appl. No. 13/741,090 dated Jan. 22, 2015; 20 pages.
USPTO Final Rejection for U.S. Appl. No. 13/741,090 dated Jun. 12, 2015; 20 pages.
USPTO Final Rejection for U.S. Appl. No. 13/741,145 dated Jan. 7, 2015; 23 pages.
USPTO Non Final Rejection for U.S. Appl. No. 11/823,982 dated Mar. 19, 2009; 14 pages.
USPTO Non Final Rejection for U.S. Appl. No. 11/824,249 dated Sep. 26, 2012; 11 pages.
USPTO Non Final Rejection for U.S. Appl. No. 13/191,806 dated Jul. 24, 2014; 19 pages.
USPTO Non Final Rejection for U.S. Appl. No. 13/345,504 dated Jul. 29, 2014; 10 pages.
USPTO Non Final Rejection for U.S. Appl. No. 13/741,090 dated Apr. 2, 2015; 19 pages.
USPTO Non Final Rejection for U.S. Appl. No. 13/741,090 dated Oct. 28, 2014; 18 pages.
USPTO Non Final Rejection for U.S. Appl. No. 13/741,145 dated Oct. 29, 2014; 21 pages.
USPTO Non Final Rejection for U.S. Appl. No. 13/917,528 dated Nov. 15, 2013; 12 pages.
USPTO Non-Final Rejection for U.S. Appl. No. 11/600,255 dated Mar. 29, 2010; 10 pages.
USPTO Non-Final Rejection for U.S. Appl. No. 11/601,465 dated Oct. 2, 2008; 10 pages.
USPTO Non-Final Rejection for U.S. Appl. No. 11/601,465 dated Dec. 28, 2007; 16 pages.
USPTO Non-Final Rejection for U.S. Appl. No. 11/729,818 dated Dec. 17, 2008; 12 pages.
USPTO Non-Final Rejection for U.S. Appl. No. 11/824,249 dated Mar. 30, 2012; 10 pages.
USPTO Non-Final Rejection for U.S. Appl. No. 11/824,249 dated May 25, 2011; 9 pages.
USPTO Non-Final Rejection for U.S. Appl. No. 12/332,980 dated Dec. 22, 2010; 9 pages.
USPTO Non-Final Rejection for U.S. Appl. No. 12/380,141 dated Sep. 5, 2012; 6 pages.
USPTO Non-Final Rejection for U.S. Appl. No. 12/844,798 dated Feb. 4, 2014; 27 pages.
USPTO Non-Final Rejection for U.S. Appl. No. 12/844,798 dated Feb. 14, 2012; 18 pages.
USPTO Non-Final Rejection for U.S. Appl. No. 12/844,798 dated Jul. 11, 2013; 23 pages.
USPTO Non-Final Rejection for U.S. Appl. No. 12/844,798 dated Oct. 10, 2012; 19 pages.
USPTO Non-Final Rejection for U.S. Appl. No. 12/861,812 dated Apr. 15, 2011; 26 pages.
USPTO Non-Final Rejection for U.S. Appl. No. 13/049,798 dated Nov. 20, 2013; 12 pages.
USPTO Non-Final Rejection for U.S. Appl. No. 13/191,806 dated Dec. 17, 2013; 21 pages.
USPTO Non-Final Rejection for U.S. Appl. No. 13/342,942 dated Jun. 18, 2015; 9 pages.
USPTO Non-Final Rejection for U.S. Appl. No. 13/360,296 dated May 20, 2015; 15 pages.
USPTO Non-Final Rejection for U.S. Appl. No. 13/590,390 dated Mar. 10, 2015; 14 pages.
USPTO Notice of Allowance for U.S. Appl. No. 11/600,255 dated Jul. 27, 2010; 6 pages.
USPTO Notice of Allowance for U.S. Appl. No. 11/729,818 dated Nov. 13, 2009; 7 pages.
USPTO Notice of Allowance for U.S. Appl. No. 11/823,982 dated Oct. 6, 2009; 12 pages.
USPTO Notice of Allowance for U.S. Appl. No. 11/824,249 dated Mar. 14, 2013; 5 pages.
USPTO Notice of Allowance for U.S. Appl. No. 12/167,100 dated Jan. 12, 2011; 8 pages.
USPTO Notice of Allowance for U.S. Appl. No. 12/167,100 dated Apr. 29, 2011; 8 pages.
USPTO Notice of Allowance for U.S. Appl. No. 12/167,100 dated Jun. 28, 2011; 8 pages.
USPTO Notice of Allowance for U.S. Appl. No. 12/167,100 dated Sep. 1, 2011; 8 pages.
USPTO Notice of Allowance for U.S. Appl. No. 12/167,100 dated Sep. 30, 2010; 7 pages.
USPTO Notice of Allowance for U.S. Appl. No. 12/332,980 dated Oct. 4, 2011; 5 pages.
USPTO Notice of Allowance for U.S. Appl. No. 12/380,141 dated Nov. 8, 2012; 7 pages.
USPTO Notice of Allowance for U.S. Appl. No. 12/844,798 dated May 15, 2014; 8 pages.
USPTO Notice of Allowance for U.S. Appl. No. 13/049,798 dated May 28, 2014; 11 pages.
USPTO Notice of Allowance for U.S. Appl. No. 13/191,806 dated Jan. 30, 2015; 9 pages.
USPTO Notice of Allowance for U.S. Appl. No. 13/342,942 dated Aug. 21, 2015; 8 pages.
USPTO Notice of Allowance for U.S. Appl. No. 13/345,504 dated Sep. 18, 2014; 8 pages.
USPTO Notice of Allowance for U.S. Appl. No. 13/612,803 dated May 2, 2013; 8 pages.
USPTO Notice of Allowance for U.S. Appl. No. 13/612,803 dated Aug. 21, 2013; 9 pages.
USPTO Notice of Allowance for U.S. Appl. No. 13/612,803 dated Dec. 10, 2012; 8 pages.
USPTO Notice of Allowance for U.S. Appl. No. 13/741,145 dated Feb. 23, 2015; 5 pages.

(56) References Cited

OTHER PUBLICATIONS

USPTO Notice of Allowance for U.S. Appl. No. 13/917,528 dated Apr. 16, 2014; 8 pages.
USPTO Notice of Allowance, U.S. Appl. No. 13/047,620, dated Apr. 11, 2012, 19 pages.
Written Opinion of the International Searching Authority for International Application No. PCT/US08/13622 mailed Feb. 9, 2009; 5 pages.
USPTO Notice of Allowance for U.S. Appl. No. 11/601,465 dated May 8, 2009; 6 pages.

\* cited by examiner

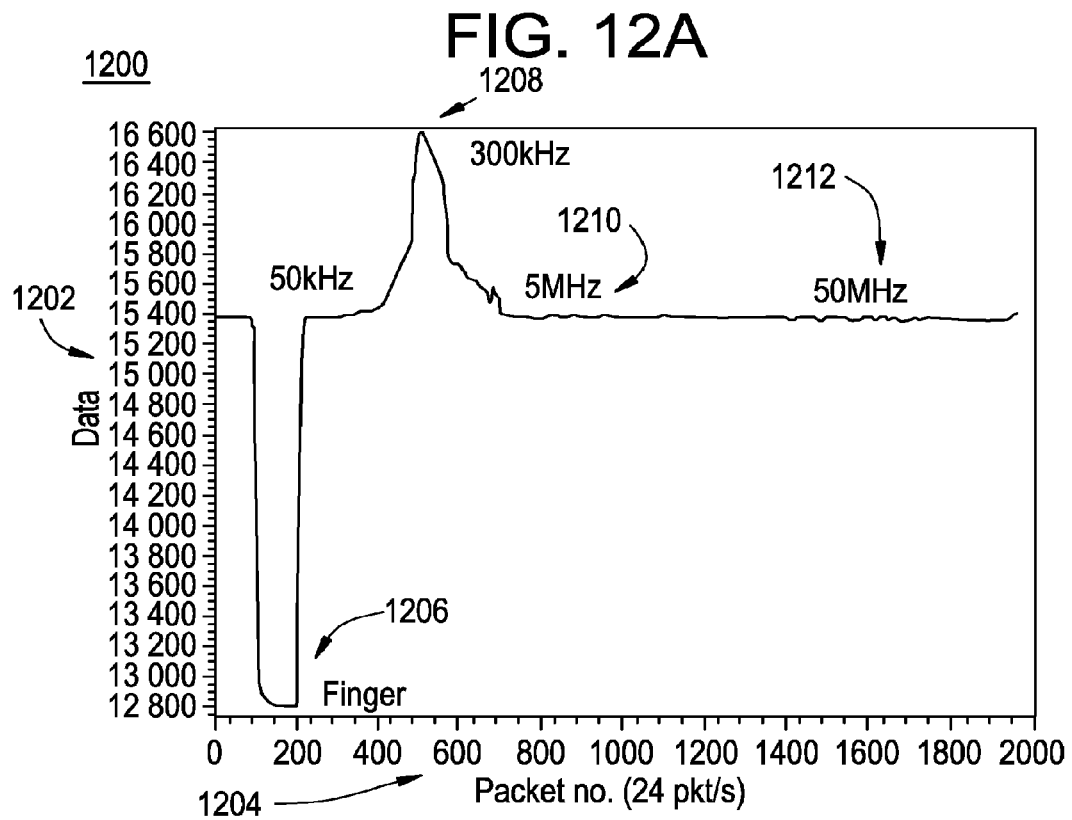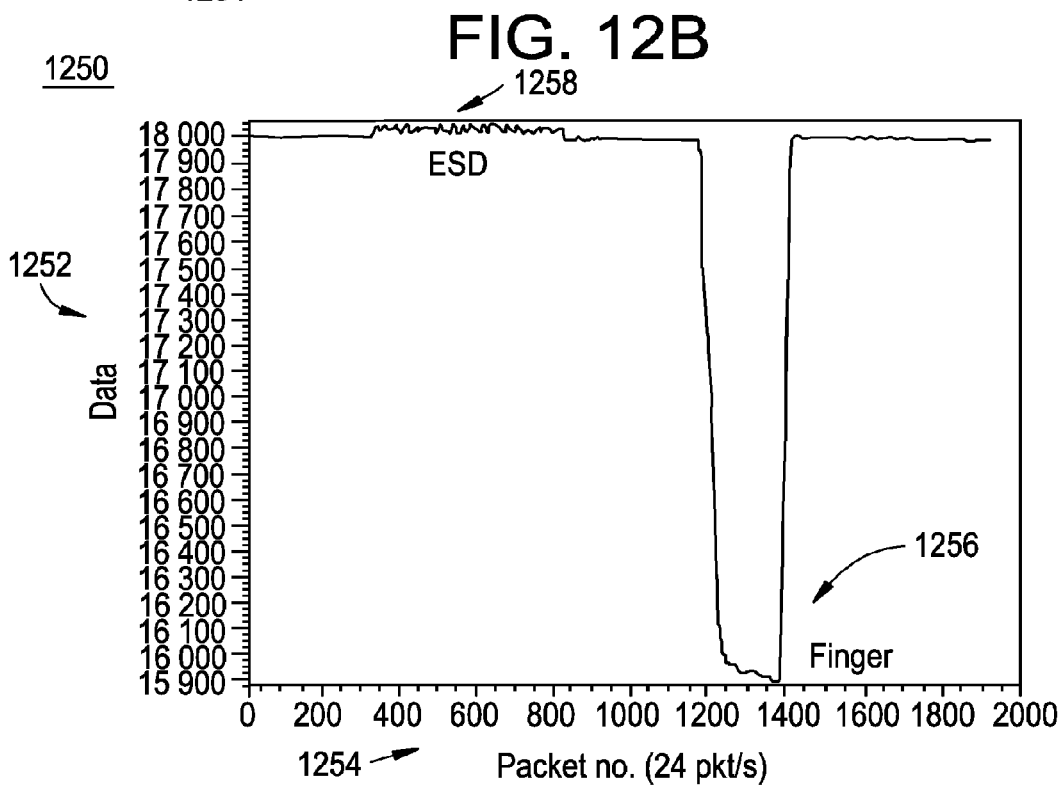

1300

CAPACITIVE FIELD SENSOR WITH SIGMA-DELTA MODULATOR

CROSS REFERENCE TO RELATED APPLICATIONS

This application is a continuation of U.S. patent application Ser. No. 13/612,803, filed Sep. 12, 2012, which is a continuation of U.S. patent application Ser. No. 12/380,141 filed Feb. 23, 2009, which claims the benefit of U.S. Provisional Application No. 61/030,526, filed Feb. 21, 2008, and is a continuation-in-part of U.S. Pat. No. 8,089,289 filed Jul. 2, 2008, which claims the benefit of U.S. Provisional Application No. 60/947,865 filed Jul. 3, 2007, all of which are hereby incorporated by reference herein in their entirety.

TECHNICAL FIELD

This disclosure relates generally to electronic circuits, and in particular but not exclusively, relates to capacitance sensing circuits.

BACKGROUND INFORMATION

Capacitance sensors are used to implement a variety of useful functions including touch sensors (e.g., touch pad, touch dial, touch wheel, etc.), determining the presence of an object, accelerometers, and other functions. In general, capacitive sensors are intended to replace mechanical buttons, knobs, and other similar mechanical user interface controls. A capacitive sensor permits eliminating complicated mechanical switches and buttons, providing reliable operation under harsh conditions. Capacitive sensors are widely used in the modem consumer applications, providing new user interface options in the existing products (cell phones, digital music players, personal digital assistances, etc.).

One class of capacitive sensor uses a charge transfer technique. Referring to FIG. 1A, the charge transfer technique charges a sensing capacitor Cx in one phase (switch SW1 closed, switch SW2 open) and discharges the sensing capacitor Cx into a summing capacitor Csum in a second phase (SW1 open, SW2 closed). Switches SW1 and SW2 are operated in a non-overlapping manner repeating the transfer of charge from Cx to Csum.

$$V_{Csum} = V_{dd}\left(1 - e^{-N\frac{Cx}{Csum}}\right) \qquad \text{(Equation 1)}$$

where $V_{Csum}$ represents the voltage on Csum, N represents the cycle count, Cx and Csum represent capacitance values, and Vdd represents a power supply voltage. Accordingly, the capacitance of Cx can be determined by measuring the number of cycles (or time) required to raise Csum to a predetermined voltage potential.

The charge transfer method is advantageous due to its relative low sensitivity to RF fields and RF noise. This relative noise immunity stems from the fact that the sensing capacitor Cx is typically charged by a low-impedance source and the charge is transferred to a low-impedance accumulator (i.e., the summing capacitor Csum). However, conventional capacitance sensors have the disadvantage that voltage on the summing capacitor Csum rises versus time/cycles in an exponential manner (see FIG. 1B and Equation 1). The exponential relationship between the accumulated voltage potential on Csum and the charge transfer time/cycles requires some linearization if the capacitance of Cx is calculated as a function of the voltage potential on Csum after a predetermined time or number of cycles.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

FIGS. 12A-B are graphs of exemplary signals of an exemplary capacitive sensing system, in accordance with an embodiment of the invention.

DETAILED DESCRIPTION

Embodiments of an apparatus and method for a capacitive sensor with a sigma-delta modulator are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1A:
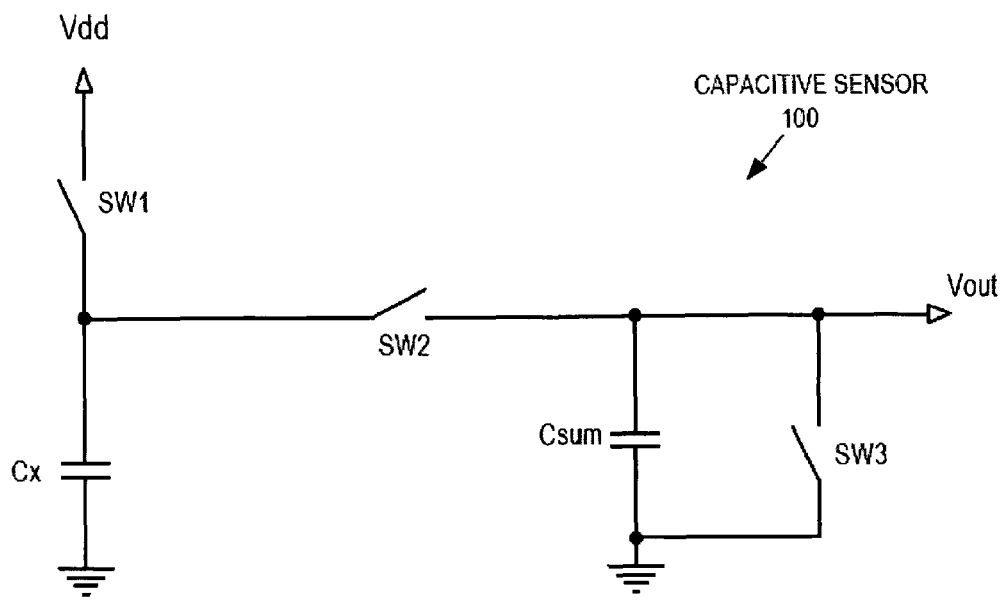
FIG. 1A is a circuit diagram illustrating a conventional capacitance sensor circuit.
Figure 1B:
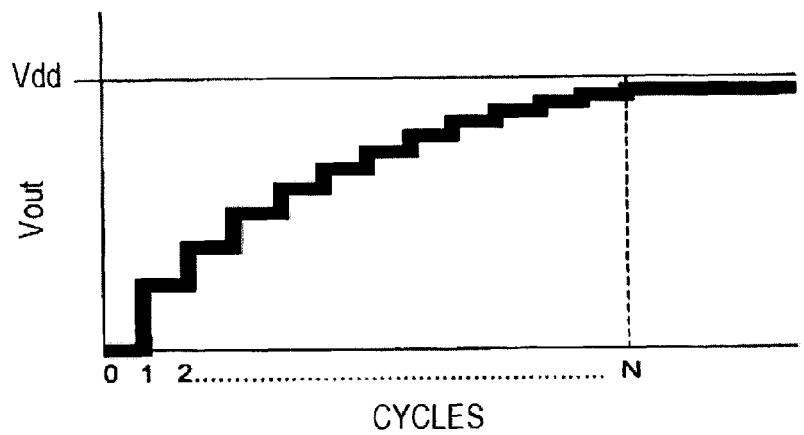
FIG. 1B is a graph illustrating the exponential relationship between voltage on a summing capacitor and charge transfer cycles.
Figure 2:
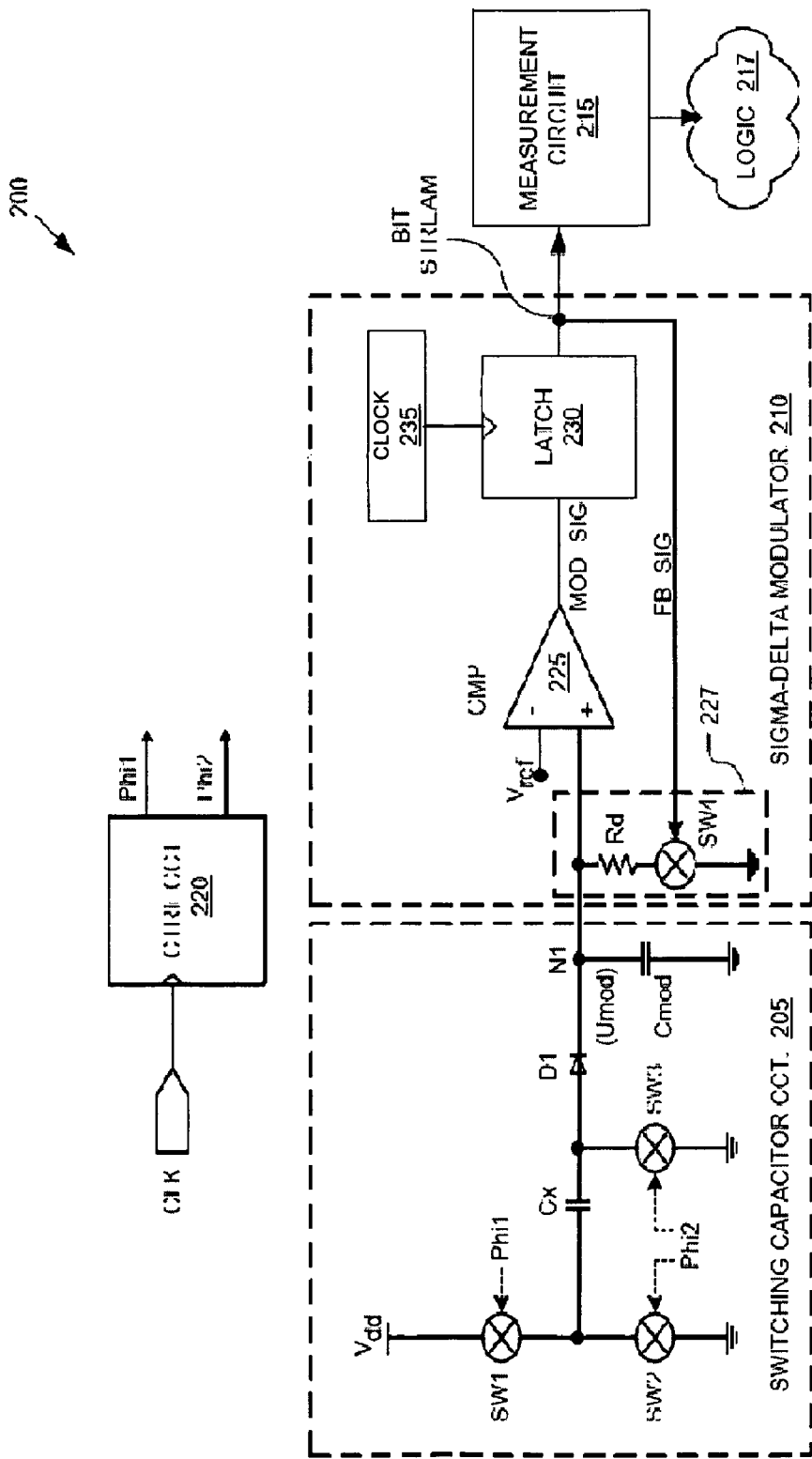
FIG. 2 is circuit diagram of a capacitive sensor with a sigma-delta modulator, in accordance with an embodiment of the invention.

FIG. 2 is a circuit diagram illustrating a capacitive sensor 200, in accordance with an embodiment of the invention. Capacitive sensor 200 is capable of converting the measurement of the capacitance of sensing capacitor (Cx) into the measurement of the duty cycle of a feedback pulse signal (FB_SIG). Furthermore, the relationship between the duty cycle of FB_SIG and the capacitance of Cx is substantially linear. Capacitive sensor 200 may also be regarded as a switching capacitor current to duty cycle converter.

The illustrated embodiment of capacitance sensor 200 includes a switching capacitor circuit 205, sigma-delta modulator 210, a measurement circuit 215, logic 217, and a control circuit 220. The illustrated embodiment of switching capacitor circuit 205 includes sensing capacitor (Cx), switches SW1, SW2, and SW3, a diode D1, and a modulation capacitor (Cmod). The illustrated embodiment of sigma-delta modulator 210 includes a comparator (CMP) 225, a latch 230, a clock source 235, a discharge resistor (Rd), and a discharge switch SW4. Collectively, the discharge resistor Rd and discharge switch SW4 may be referred to as a charge dissipation circuit 227. While component values of switching capacitor circuit 205 and sigma-delta modulator 210 may vary based on the particular application, in general, the capacitance of Cmod will be substantially larger than the capacitance of Cx. Since Cmod acts to accumulate charge transferred from Cx over multiple cycles, it is often referred to as a summing capacitor or an integrating capacitor. In one embodiment, comparator 225 is an analog voltage comparator.

Figure 3:
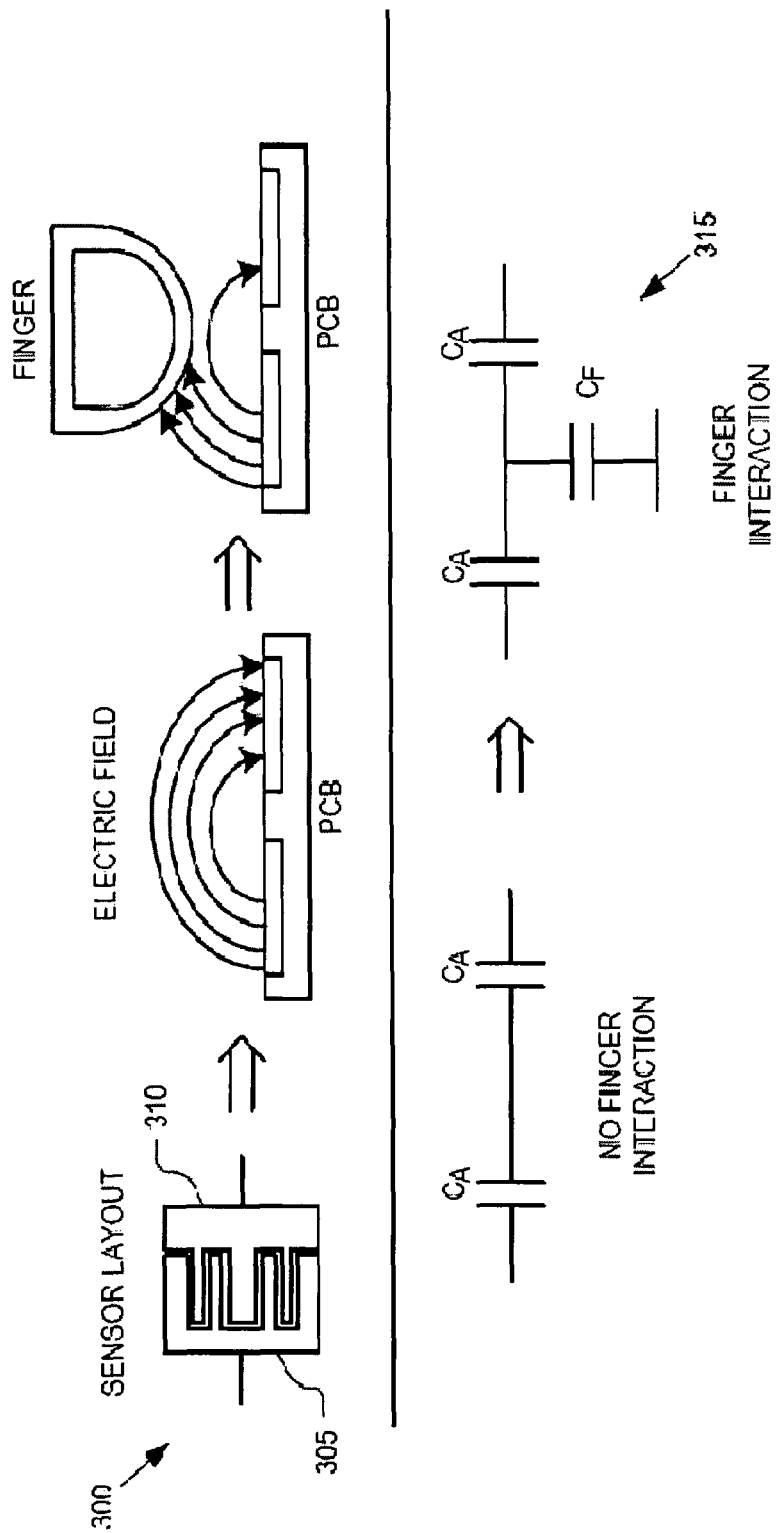
FIG. 3 is a diagram illustrating operation of a capacitive field sensor, in accordance with an embodiment of the invention.

FIG. 3 is a diagram illustrating operation of a capacitive field sensor 300, in accordance with an embodiment of the invention. Capacitive field sensor 300 may be used to implement a user interface of an electronic device. Capacitive field sensor 300 is one possible physical implementation of sense capacitor Cx. The illustrated embodiment of capacitive field sensor 300 is made of two interlocking combs 305 and 310 on a printed circuit board (PCB) substrate. Each comb has a capacitance represented as $C_A$ while the finger has a variable capacitance represented as $C_F$. The sense capacitance Cx represents the capacitance divider circuit 315 formed when the finger is brought into proximity with capacitive field sensor 300.

During a finger touch event, part of electric field is shunted to ground. From simplified equivalent schematic point of view this can be illustrated as adding the finger capacitance $C_F$, which forming the capacitive voltage divider 315. The finger capacitance changes the transmission coefficient of the capacitance divider circuit 315. It is this overall change in capacitance that is sensed by capacitive sensor 200 and converted into a measurement of the duty cycle of a signal FB_SIG output from latch 230 and measured by measurement circuit 215. In one embodiment, logic 217 includes hardware and/or software logic for deciding when a significant change in the duty cycle of FB_SIG should be recognized as a valid finger interaction with capacitive field sensor 300.

Figure 4A:
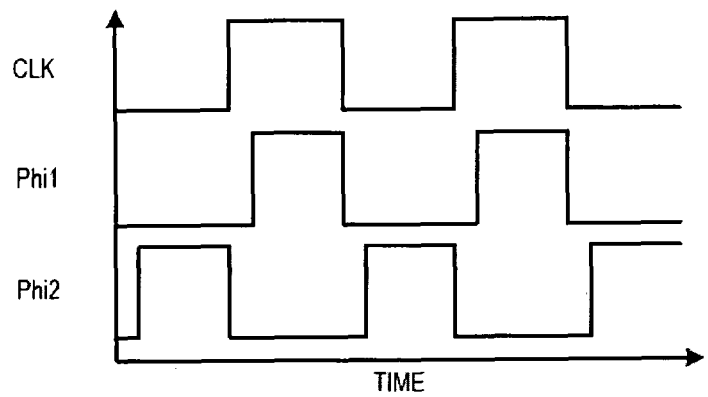
FIG. 4A is a timing diagram illustrating non-overlapping clock signals, in accordance with an embodiment of the invention.
Figure 4B:
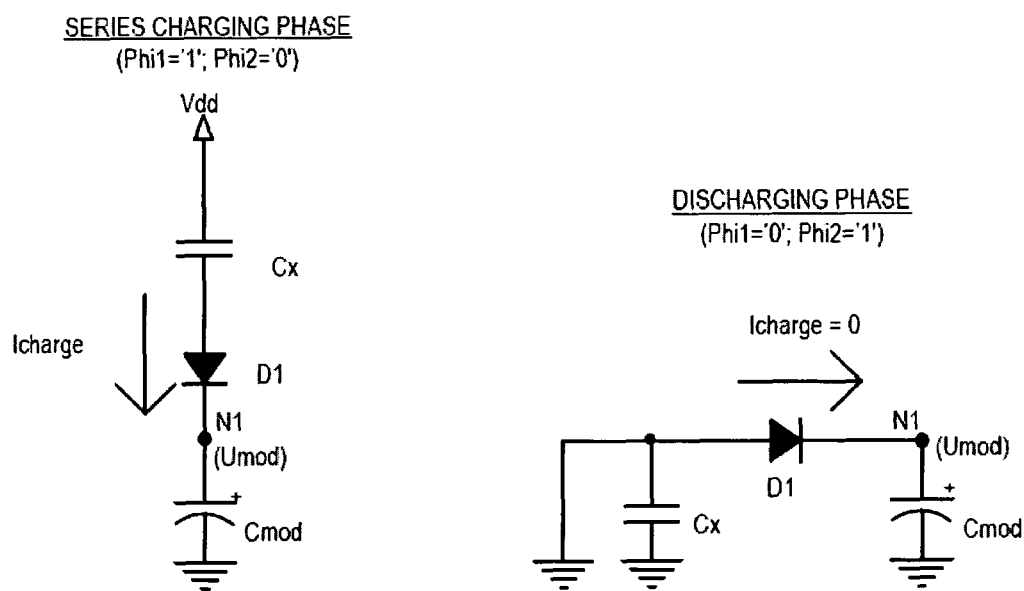
FIG. 4B includes two phase diagrams illustrating operation of a switching capacitor circuit, in accordance with an embodiment of the invention.

FIGS. 4A and 4B illustrate the two non-overlapping phase operation of switching capacitor circuit 205, in accordance with an embodiment of the invention. In one embodiment, during operation of capacitive sensor 200, two configuration phases of switching capacitor circuit 205 are cycled through to perform capacitive sensing. The two phases include: a series charging phase (control signal Phi1 asserted) and a discharge phase (control signal Phi2 asserted).

In one embodiment, control signals Phi1 and Phi2 (see FIG. 2) are generated by control circuit 220 based on a single clock signal CLK. As illustrated in FIG. 4A, Phi1 and Phi2 are generated as non-overlapping pulse signals sufficiently spaced to prevent cross conduction or latch up between SW1, SW2, and SW3. As illustrated in FIG. 4B, during the series charging phase (Phi1='1'; Phi2='0'), Phi1 close circuits SW1 and open circuits SW2 and SW3. This configuration couples sensing capacitor Cx in series with modulation capacitor Cmod. A charging current Icharge flows from the power source Vdd to ground through Cx, D1, and Cmod causing Cx and Cmod to charge. During the charging phase, diode D1 conducts Icharge in a forward biased operating regime.

During the discharging phase (Phi2='1'; Phi1='0'), Phi1 open circuits SW1 and close circuits SW2 and SW3. This configuration disconnects the power source Vdd, while coupling both terminals of sensing capacitor Cx to ground to discharge the sensing capacitor. This configuration also reverse biases diode D1, which prevents Cmod from discharging. Accordingly, the voltage Umod at node N1 is held during the discharging phase. When a finger is moved in proximity to field sensor 300, the variable capacitance of Cx is increased causing less charge to be passed to Cmod during each series charging phase. The greater charge captured by Cx during the charging phase is discharged to ground during the discharge phase. Therefore, the larger Cx, the greater the number of switching cycles of SW1, SW2, and SW3 to charge Cmod to a given voltage.

During operation, the charge on Cmod accumulates via the technique described above until the voltage Umod at node N1 reaches Vref. At this point, the output MOD_SIG from CMP 225 toggles, which is latched and fed back to control switch SW4 as feedback signal FB_SIG. FB_SIG causes switch SW4 to close circuit. Discharge circuit 227 discharges Cmod through Rd until Umod drops below Vref, causing MOD_SIG to toggle once again. Latch 230 introduces a small delay into the feedback path prior to open circuiting SW4. This latch delay is controlled by clock source 235. Once SW4 is open circuited, the switching of SW1, SW2, and SW3 recharges Cmod once again. The voltage Umod continuously dithers back and forth about Vref generating a square wave at the output latch 230. This square wave is analyzed by measurement circuit 215 to determine the duty cycle or percentage of time FB_SIG is high versus low. This percentage averaged over time is representative of the capacitance or capacitance change of sensing capacitor Cx.

Figure 9A:
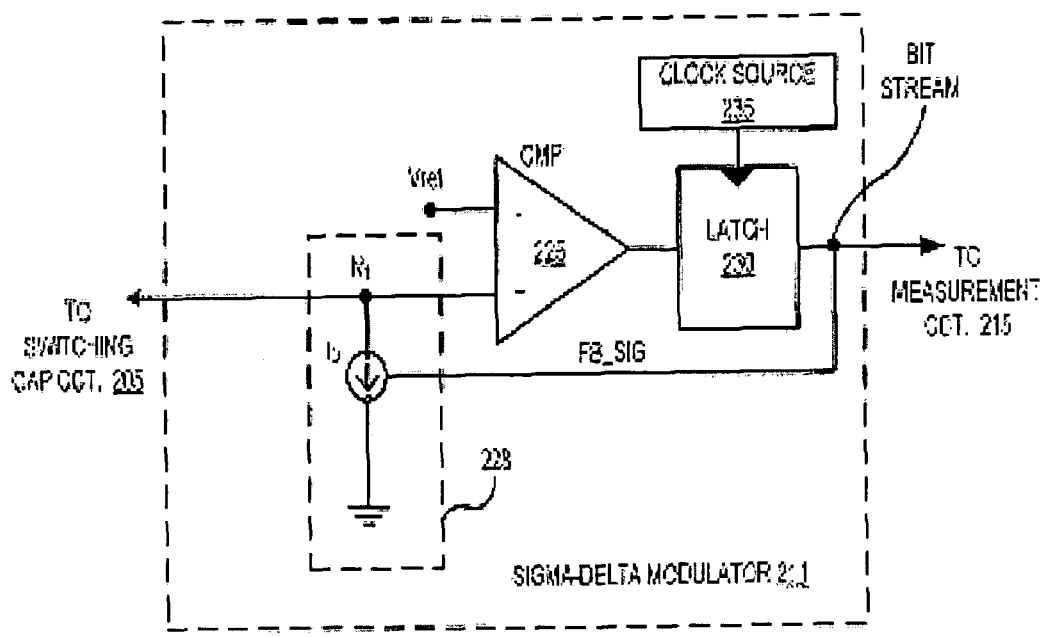
FIGS. 9A-C are circuit diagrams illustrating alternative dissipation circuit implementations within a sigma-delta modulator, in accordance with embodiments of the invention.
Figure 9B:
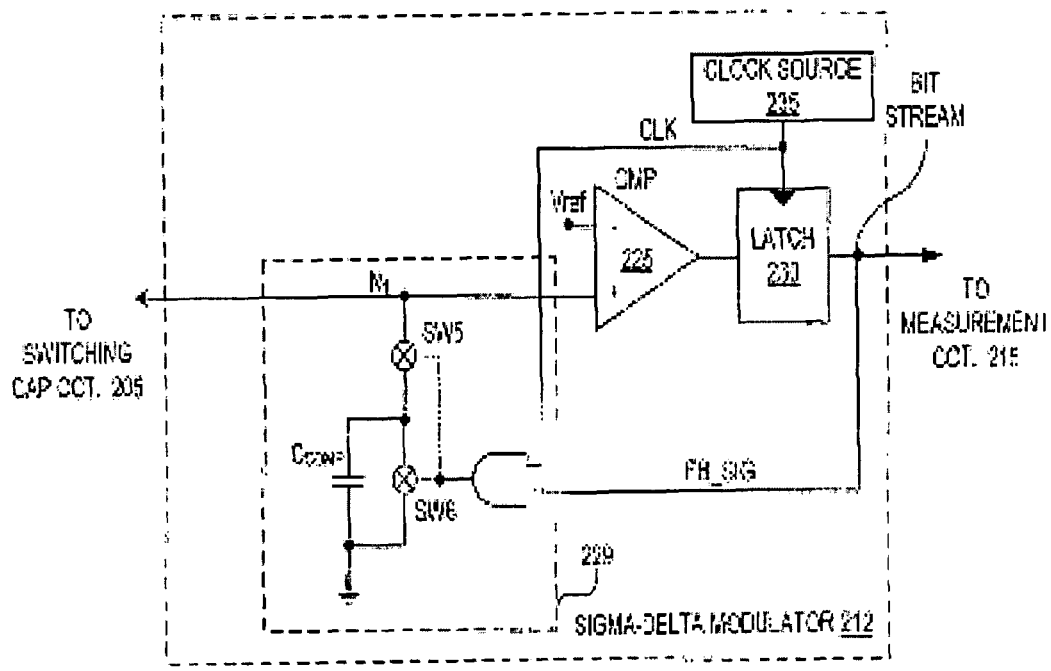
Figure 9C:
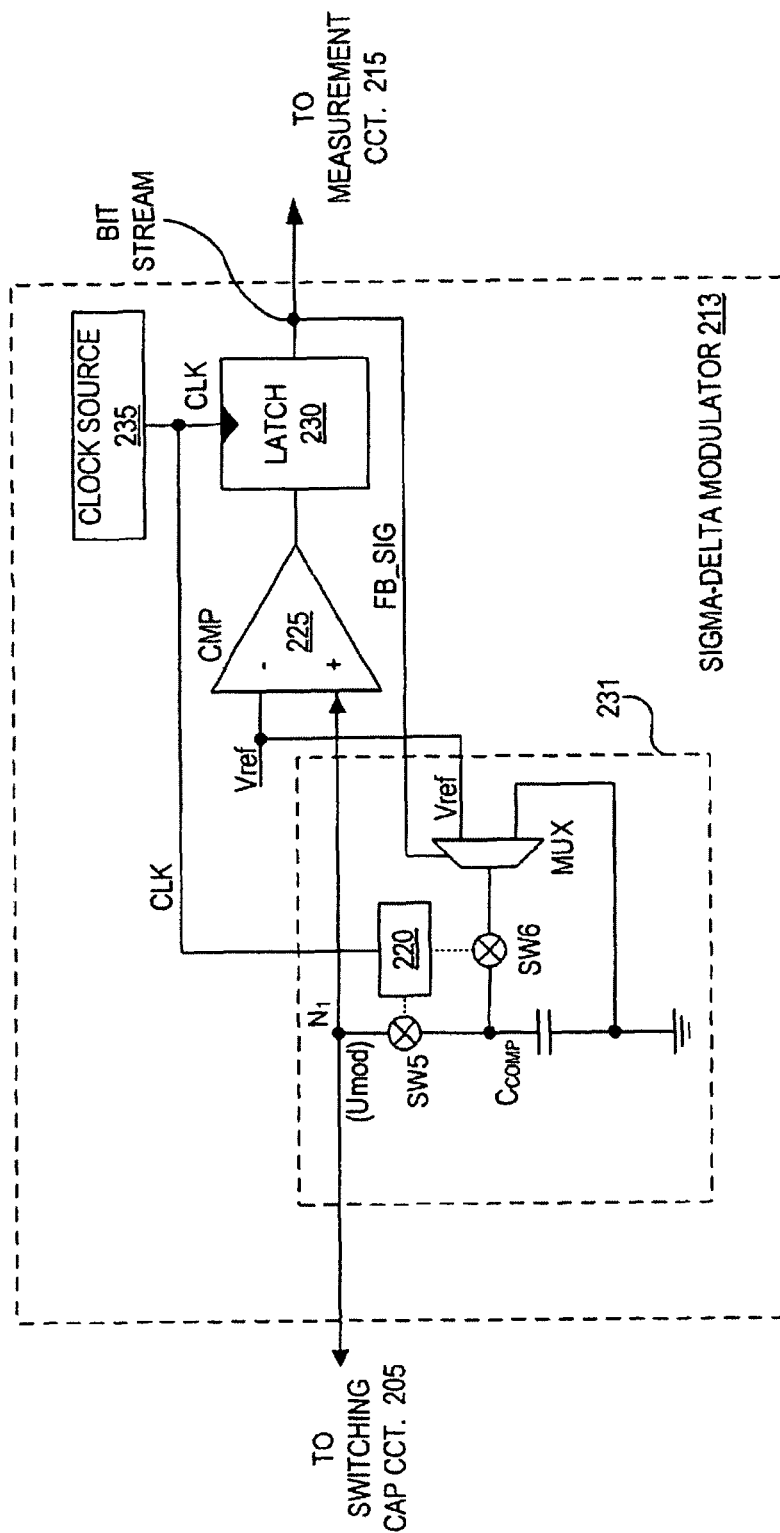

FIGS. 9A-C are circuit diagrams illustrating alternative implementations of charge dissipation circuit 227, in accordance with embodiments of the invention. FIG. 9A illustrates a sigma-delta modulator 211 having a charge dissipation circuit 228, which replaces SW4 and discharge resistor Rd of charge dissipation circuit 227 with a current source ID controlled by feedback pulse signal FB_SIG. When FB_SIG is a logic HIGH, current source sinks a current ID from capacitor Cmod to ground. When FB is logic LOW, current source is disabled.

FIG. 9B illustrates sigma-delta modulator 212 having a charge dissipation circuit 229 including a switching capacitor resistor circuit with a gated clock source. When FB_SIG is logic HIGH, the clock signal CLK is applied to the switches SW5 and SW6 with non-overlapping pulses (e.g., such as clock signals Phi1 and Phi2 generated by control circuit 220), causing a discharging current to flow to ground from modulator capacitor Cmod. At a logic LOW value for FB_SIG, the clock signal CLK is gated and switching capacitor circuit Ccomp does not sink current from modulator capacitor Cmod.

FIG. 9C illustrates a sigma-delta modulator 213 having a charge dissipation circuit 231 where the non-overlapping clock phases Phi1 and Phi2 are applied constantly to switches SW5 and SW6, but SW5 and SW6 are selectively connected in series between Umod and either Vref or ground by the multiplexor MUX, depending on the value of the feedback pulse signal FB_SIG. The principle of operating of charge dissipation circuit 231 is similar to charge dissipation circuit 229 in that SW5, SW6, and Ccomp operate as a switching capacitor resistor circuit.

Figure 5:
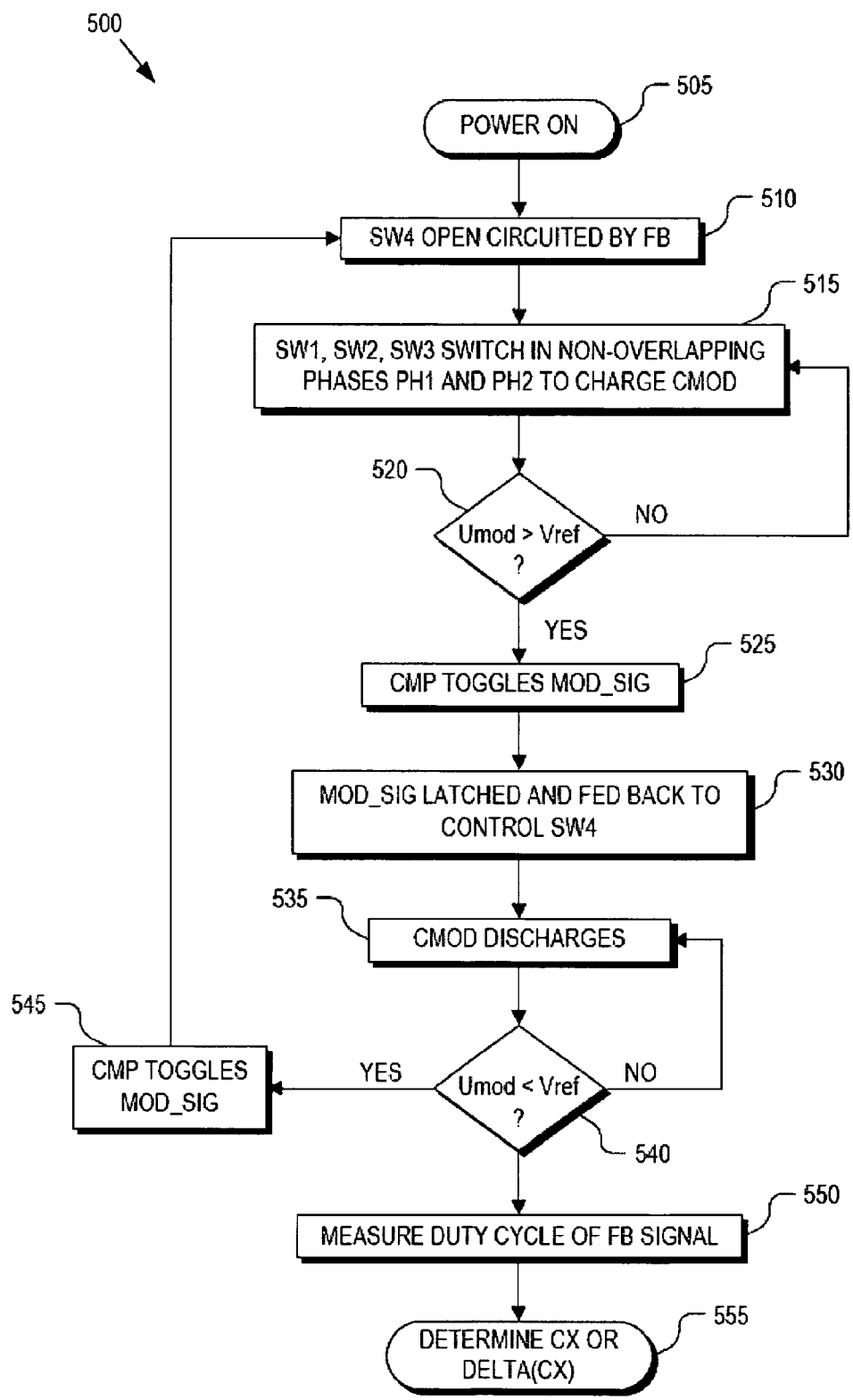
FIG. 5 is a flow chart illustrating operation of a capacitive sensor with a sigma-delta modulator, in accordance with an embodiment of the invention.

FIG. 5 is a flow chart illustrating operation of a capacitive sensor 200 in further detail, in accordance with an embodiment of the invention. The order in which some or all of the process blocks appear in process 500 should not be deemed limiting. Rather, one of ordinary skill in the art having the benefit of the present disclosure will understand that some of the process blocks may be executed in a variety of orders not illustrated, or even in parallel.

In a process block 505, capacitance sensor 200 is powered on and the output of CMP 210 (MOD_SIG) is initially low, assuming Cmod is initially discharged and the voltage Umod is less than Vref. In this state, MOD_SIG is logic "LOW". On the next rising clock edge output from clock source 235, latch 230 latches the value of MOD_SIG to its output. This output is fed back to the control terminal of switch SW4 as feedback signal FB_SIG. A logic LOW open circuits SW4 decoupling node N1 from ground (process block 510) and permitting Cmod to accumulate charge.

With power provided to switching capacitor circuit 205, switches SW1, SW2, and SW3 commence operation (process block 515). Switches SW1, SW2, and SW3 switch under control of a control signals Phi1 and Phi2 generated by control circuit 220, as discussed above. As switching capacitor circuit 205 begins charging Cmod, the voltage potential Umod at node N1 begins to rise gradually. Cmod continues to accumulate charge until Umod reaches Vref, as determined by CMP 225 (decision block 520). When Umod reaches or passes Vref, CMP 225 toggles its output (MOD_SIG) to a logic "HIGH" (process block 525).

In a process block 530, latch 230 latches the value of MOD_SIG to its output as FB_SIG. Latching is synchronized to a clock signal output by clock source 235. FB_SIG is fed back to discharge switch SW4. The toggled value is a logic HIGH, which close circuits discharging switch SW4 and commences discharge of Cmod through Rd (process block 535). Cmod is discharged until Umod drops back below Vref, as determined by CMP 225 (decision block 540), at which point CMP 225 toggles MOD_SIG (process block 545). Discharge switch SW4 is once again open circuited after MOD SIG is latched and process 500 repeats from process block 510.

After an initial transitory startup phase, capacitance sensor 200 enters its steady state phase where the voltage potential Umod on Cmod oscillates or dithers about Vref. This oscillation about Vref creates the modulation signal MOD SIG upon which the feedback pulse signal FB_SIG is based. Once operating in the steady state phase, the duty cycle of the FB_SIG is directly proportional to the capacitance or capacitance change of Cx.

Accordingly, in a process block 550, the duty cycle of FB_SIG is measured by measurement circuit 215. In one embodiment, measurement circuit 215 may include a clock gated by FB_SIG and a counter to count a number of clock cycles occurring while FB_SIG is HIGH for a given period of time. Furthermore, there can be other methods to extract the multi-bit digital values from the bit stream data, formed by the sigma-delta modulator, as various types of the digital filters or otherwise. Finally, in a process block 555, the measured duty cycle is used to determine the capacitance Cx or capacitance change ΔCx of the sensing capacitor. Logic 217 may use this digital code to determine whether a user finger has interacted with a capacitive field sensor within a user interface. In one embodiment, measurement circuit 215 may output a digital code indicative of the capacitance or capacitance change of Cx. In one embodiment, capacitive sensor 200 operates as a Cmod charge current (i.e., Icharge in FIG. 4B) to digital code converter. Of course, the charge current of Cmod is related to the variable capacitance of the field sensor Cx.

Figure 6:
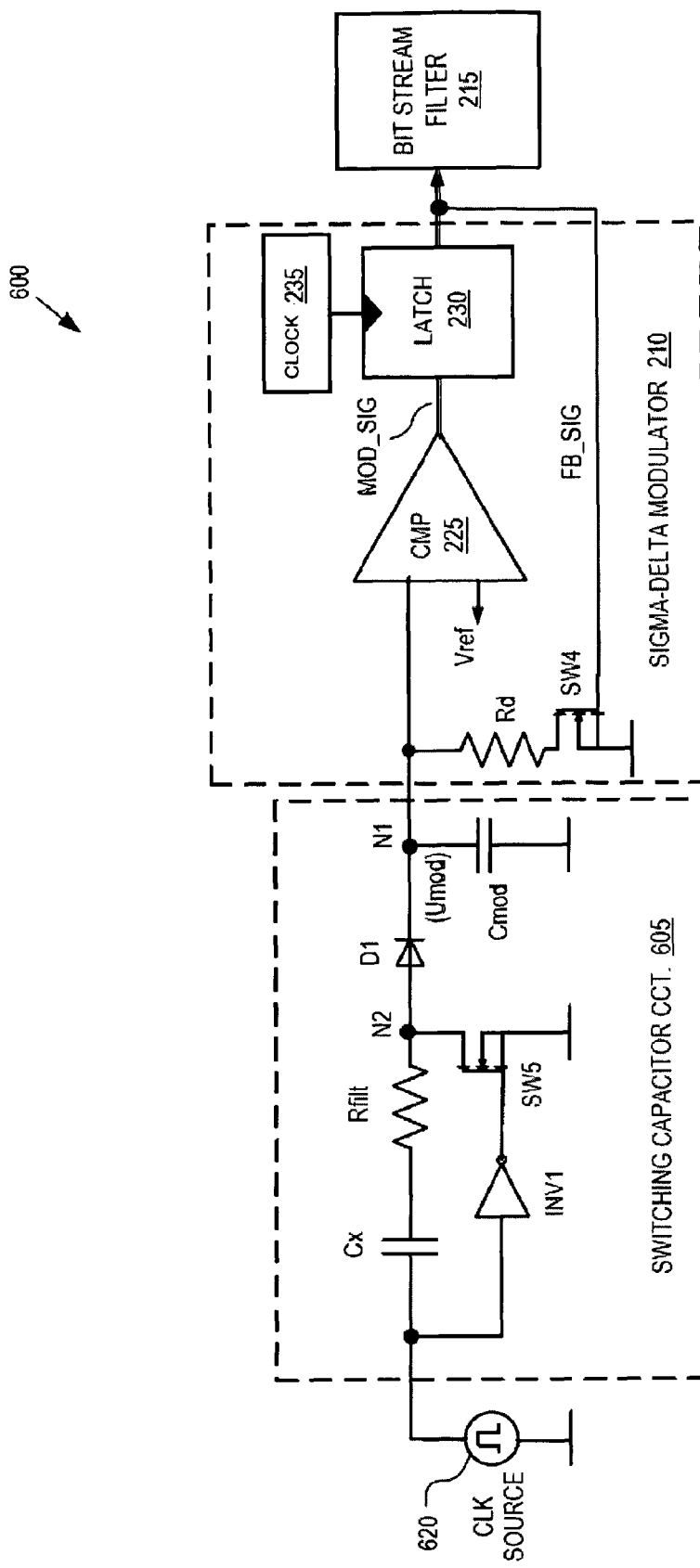
FIG. 6 is circuit diagram of a capacitive sensor with a sigma-delta modulator, in accordance with an embodiment of the invention.

FIG. 6 is a circuit diagram of a capacitive sensor 600 including a sigma-delta modulator, in accordance with an embodiment of the invention. Embodiments of the present invention provide for proximity detection (e.g., up to 1 meter or 40 inches) of objects (e.g., finger) relative to capacitive sensor 600. Capacitive sensor 600 is an alternative embodiment to capacitive sensor 200, but operates using the same principles. The illustrated embodiment of capacitive sensor 600 includes a switching capacitor circuit 605, a sigma-delta modulator 210, measurement circuit 215, and a clock source 620. The illustrated embodiment of switching capacitor circuit 605 includes sensing capacitor Cx, a filter resistor Rfilt, diode D1, modulation capacitor Cmod, a discharge switch SW5, and an inverter INV1. In one embodiment, clock source 620 is a pseudorandom signal (PRS) generator for generating a pseudo-random pulse signal. Other signal generators maybe used, such as a pulse width modulator; however, a PRS generator provides greater electromagnetic noise immunity. Additionally, other frequency spreading techniques can also be used to implement clock source 620, such as frequency sweeping, frequency hopping, changing frequency in the pseudo random order, etc.

Sigma-delta modulator 210 and measurement circuit 215 operate as discussed above in connection with capacitive sensor 200. Similarly, switching capacitor circuit 605 operates to sequentially charge Cmod, just as switching capacitor circuit 205, with a slight variation on its specific implementation. When clock source 620 outputs a logic HIGH, diode D1 is forward biased and switch SW5 is open circuited. The open circuited SW5 connects Cmod in series with Cx and clock source 620. The forward biased D1 permits a charging current to flow through sensing capacitor Cx and filter resistor Rfilt into modulation capacitor Cmod. While clock source 620 is logic HIGH, switching capacitor circuit 605 is in the "charging phase." Capacitive sensor 600 responds asymmetrically to noise and presence of an object (e.g., finger). For example, when a finger is present, there is a decrease in the electric field and a rise in capacitance of Cx which reduces the charge that is added to Cmod. The reduced charge means that Cmod takes longer to charge up to Vref. Sigma-delta modulator 210 measures a current or voltage of the Cmod capacitor and outputs a signal with a duty cycle corresponding to a rate at which the Cmod capacitor is charged. The presence of an object (e.g., finger) proximate to sensing capacitor Cx results in a decrease in the duty cycle. Similarly, the presence of noise on sensing capacitor Cx results in an increase in the duty cycle. The changes in duty cycle (e.g., increase and decrease) may be relative to a stable "non-noise" duty cycle or a baseline duty cycle. The baseline duty cycle may thus correspond to a duty cycle where there is no noise and there is not an object proximate to capacitive sensor 600. The baseline duty cycle may be set during assembly and/or configuration of capacitive sensor 600 or dynamically adjusted as capacitive sensor 600 is used to determine whether an object is proximate to capacitive sensor 600. It is appreciated that changes in duty cycle described herein may be altered (e.g., via use of an inverter) such that an object causes an increase in duty cycle while noise causes a decrease in duty cycle.

Noise can come from a variety of sources including, but not limited to, the environment, cellular telephones, radio stations, and AC noise. In one embodiment, the noise goes to capacitor Cmod as direct current after being rectified by diode D1. That is, the noise flows to capacitor Cmod as extra current. The asymmetric response (e.g., increased signal from noise and a decreased signal from the presence of an object) allows greater noise immunity because the movement of the signal in opposite directions allows for simplified separation of noise and finger signals. It is appreciated that any circuit that measures current or voltage may be used in place of sigma-delta modulator 210 (e.g., Analog to Digital converter (ADC)).

In one embodiment, capacitive sensor 600 is further noise resistant as a result of the high value of capacitor Cmod in combination with the low pass filter of the resistor Rfilt and switch SW5. Rfilt also functions to remove transient effects as CLK source 620 and switch SW5 commutate. Capacitive Sensor 600 is also noise resistant as a portion of the time (e.g., when CLK source 620 is logic LOW) sensor capacitor Cx is coupled to ground on both sides (e.g., via CLK source 620 and SW5) thereby limiting noise impact to capacitive sensor 600 during actual sampling of sensing capacitor Cx.

When clock source 620 transitions to a logic LOW, switch SW5 is closed circuited. The closed circuited SW5 connects node N2 to ground. This couples sensing capacitor Cx to ground through Rfilt and reverse biases diode D1. With Cx coupled to ground it discharges, while the reversed biased diode D1 prevents discharge from modulation capacitor Cmod and Cmod retains its voltage Umod. While clock source 620 is logic LOW, switching capacitor circuit 605 is in the "discharge phase." Each positive cycle of clock source 620 moves some part of the charge of sensing capacitor Cx to capacitor Cmod and voltage on the capacitor Cmod starts rising. For example, an ADC with constant feedback resistor to ground can be used to measure a constant voltage on capacitor Cmod.

During the discharge phase, filter resistor Rfilt and switch SW5 coupled to ground creates a high frequency cutoff low pass filter (LPF). The LPF is formed from Rfilt and switch SW5 to ground parasitic capacitance. This LPF increases noise immunity to high frequencies. The LPF prevents high amplitude, ultra high frequency noise from erroneously flipping the bias state of diode D1 and causing false triggering. In one embodiment, resistor Rfilt is tuned for optimal performance (e.g., higher resistor values are better for increased noise immunity). It is appreciated that a very high resistance decreases sensitivity of the capacitive sensor. In one embodiment, the optimal resistor value is when amplitude of the shortest PRS pluses is reduced by 10-20%.

Figure 7:
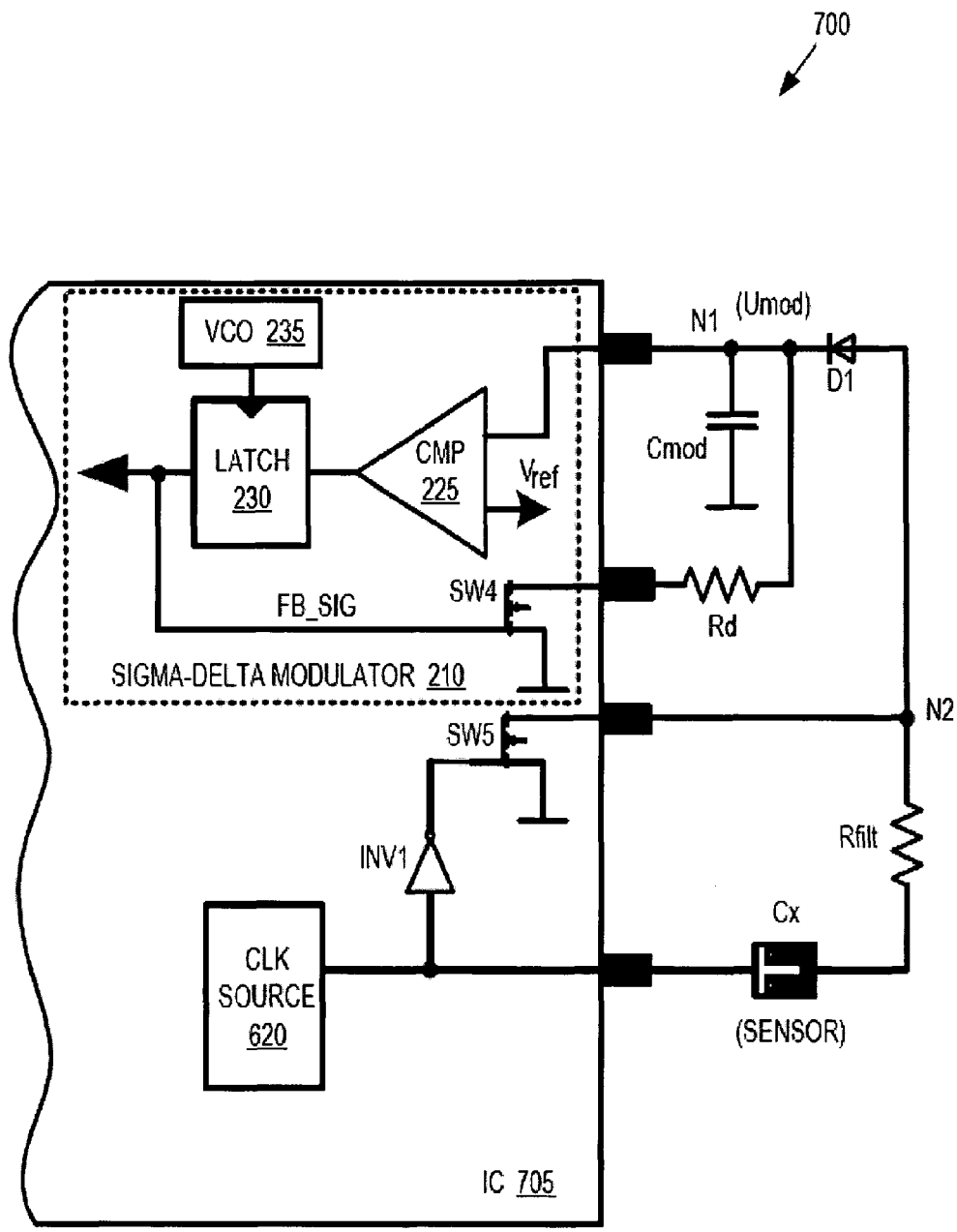
FIG. 7 is a circuit diagram illustrating pin-out connections for implementing a single field sensor interface, in accordance with an embodiment of the invention.

FIG. 7 is a circuit diagram illustrating pin-out connections for implementing a single field sensor interface 700 within an integrated circuit, in accordance with an embodiment of the invention. Integrated circuit ("IC") 705 includes sigma-delta modulator 210, clock source 620, inverter INV1, and switch SW5 integrated on a single die. The following components including: sensing capacitor Cx, filter resistor Rfilt, discharge resistor Rd, modulation capacitor Cmod, and diode D1 are externally coupled to IC 705. In one embodiment, inverter INV1 may be implemented in software or firmware using a look up table ("LUT").

Figure 8:
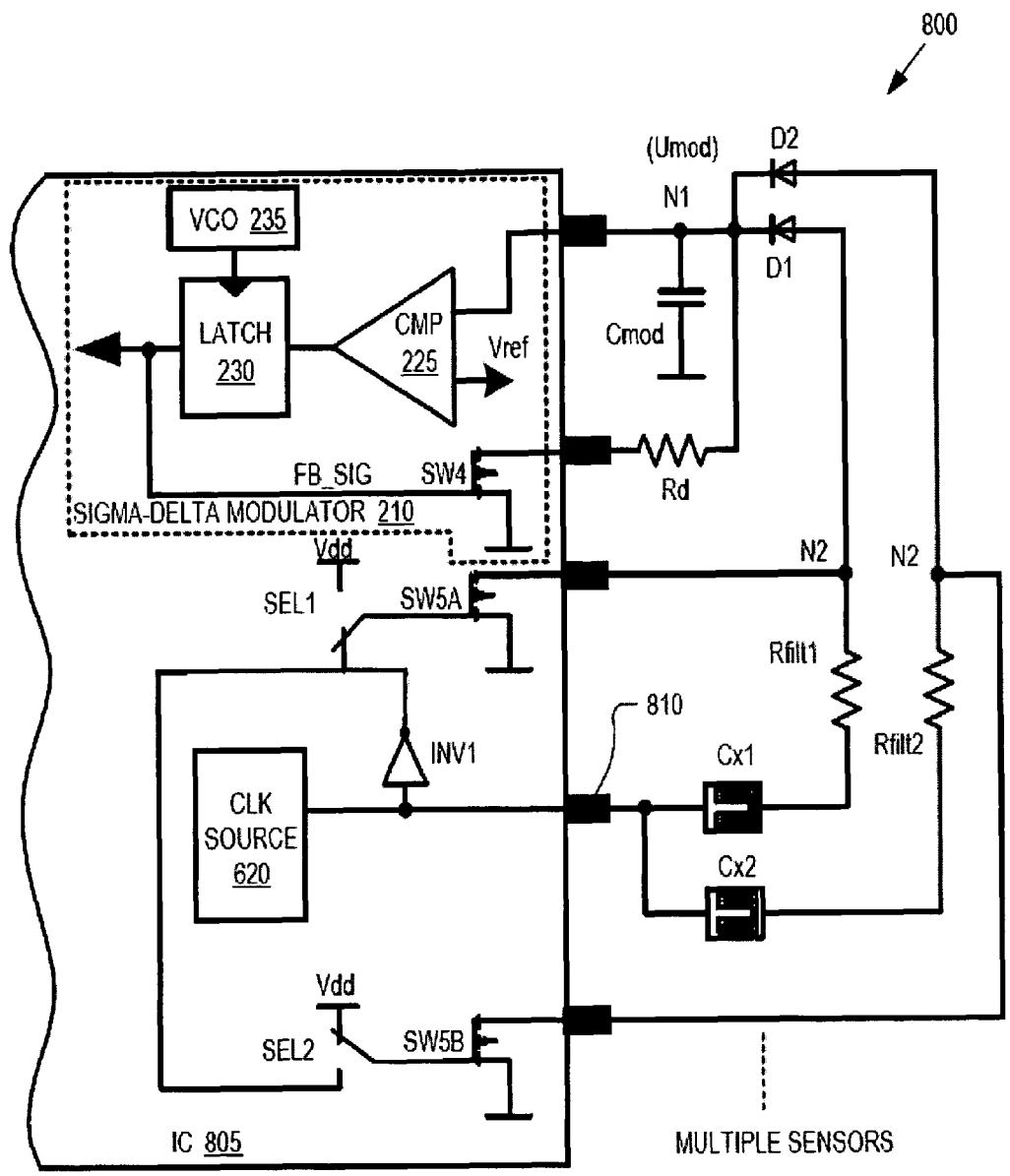
FIG. 8 is a circuit diagram illustrating pin-out connections for implementing a multi-field sensor interface time sharing a single sigma-delta modulator, in accordance with an embodiment of the invention.

FIG. 8 is a circuit diagram illustrating pin-out connections for implementing a multi field sensor interface 800 within an integrated circuit, in accordance with an embodiment of the invention. In one embodiment, IC 805 comprises firmware for selecting which sensor to scan. IC 805 couples multiple field sensors Cx1 and Cx2 to a single general purpose input/output ("GPIO") pin 810. Field sensors Cx1 and Cx2 time share a single GPIO 810, clock source 620, and sigma-delta modulator 210. However, each externally coupled sensor includes its own externally coupled filter resistor (e.g., Rfilt1, Rfilt2) and its own internal switch SW5 (e.g., SW5A, SW5B). Each field sensor Cx1 or Cx2 is scanned one at a time via appropriate switching of the select switches SEL1 and SEL2. Select switches SEL1 and SEL2 either activate the control terminals of switches SW5A and SW5B thereby grounding the corresponding field sensors Cx1 or Cx2, or connect the control terminal to the output of inverter INV1. For example, using SEL1 coupled to INV1 and SEL2 coupled to Vdd and Rfilt2 is coupled to ground allow sensor 1 to be scanned without the influence of sensor 2. Although FIG. 8 illustrates just two field sensors Cx1 and Cx2, it should be appreciated that a large number of field sensors can thus timeshare GPIO pin 810.

Figure 10:
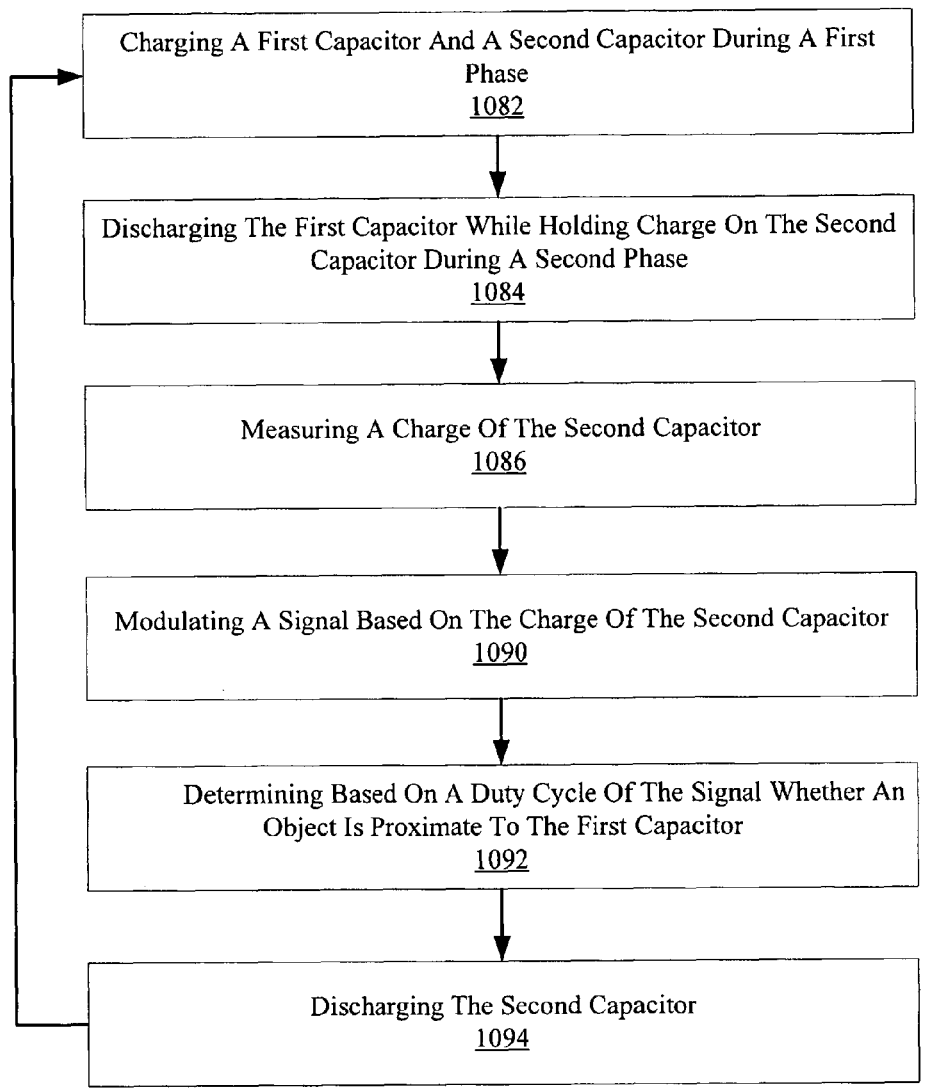
FIG. 10 is a flowchart of a method for determining the presence of an object, in accordance with an embodiment of the invention.

FIG. 10 is a flowchart of a circuit implemented method for determining the presence of an object, in accordance with an embodiment of the invention. In one embodiment, flowchart 1080 is a process for determining whether an object (e.g., finger) is proximate to a sensing capacitor based on an asymmetrical response of a capacitive sensor. It is appreciated that flowchart 1080 may be implemented in hardware, software, or a combination thereof.

In block 1082, a first capacitor (e.g., sensing capacitor ex) and a second capacitor (e.g., Cx) are charged during a first phase (e.g., CLK source 620 is HIGH).

In block 1084, the first capacitor is discharged while a charge is held on the second capacitor during a second phase (e.g., CLK source 620 is LOW). As described herein, a diode (e.g., diode D1) may be used to hold charge on the second capacitor. The diode further allows the second capacitor to be noise immune during the second phase. In block 1086, a charge of the second capacitor is measured.

In block 1090, a signal is modulated (e.g., by sigma-delta modulator 210) based on the charge of the second capacitor. In block 1092, determination based on a duty cycle of the signal is made as to whether an object is proximate to the first capacitor. As described herein, the duty cycle of the signal is asymmetrically responsive to noise and the presence of an object. The determination may be made based on the duty cycle of the signal decreasing when a finger is proximate to the first capacitor or the duty cycle of the signal increasing in response to noise. In block 1094, the second capacitor is discharged. Block 1082 may then be performed.

Figure 11A:
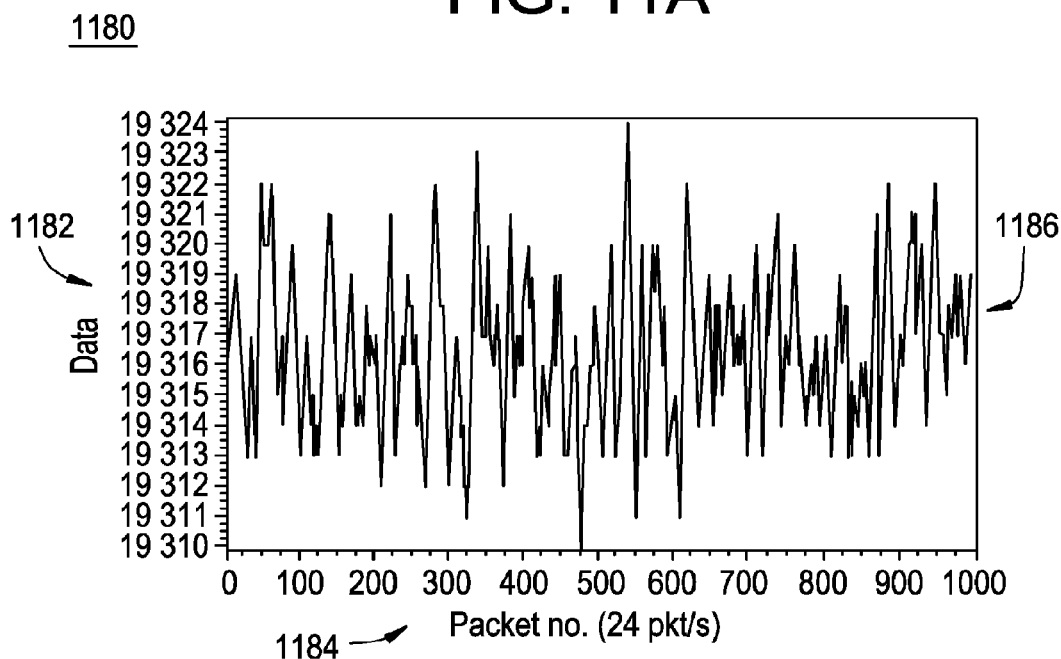
FIGS. 11A-B are graphs of exemplary signals of an exemplary capacitive sensing system, in accordance with an embodiment of the invention.
Figure 11B:
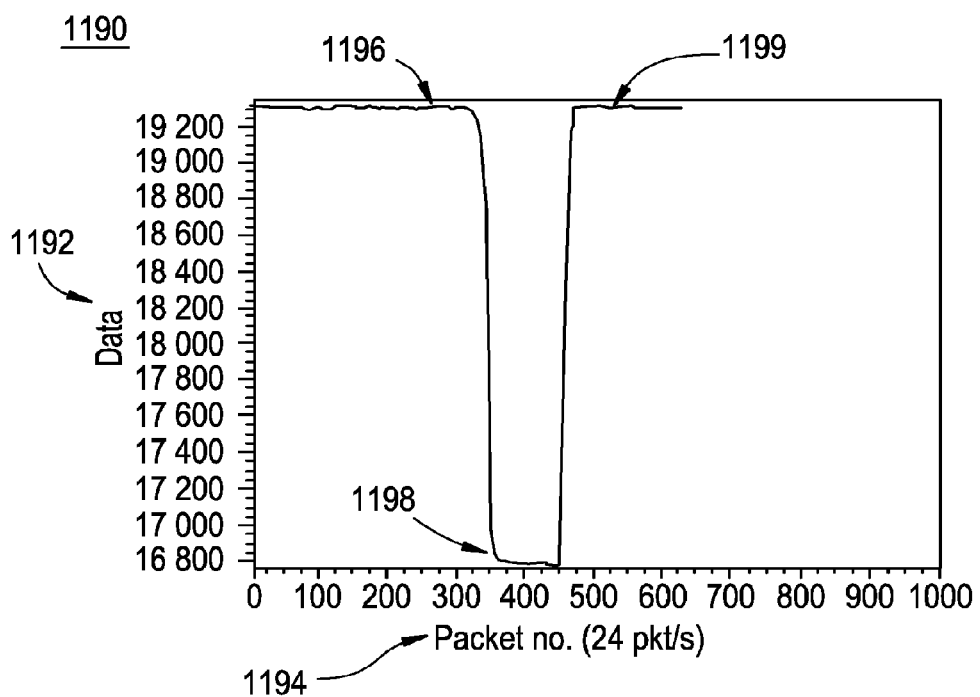

FIGS. 11A-B are graphs of exemplary signals pertinent to an exemplary capacitive sensing system, in accordance with an embodiment of the invention. FIG. 11A includes graph 1180 which illustrates an exemplary signal caused by noise. Graph 1180 includes horizontal axis 1184 representing packet number (e.g., 24 packets/second), vertical axis 1182 representing data, and signal 1186 representing the output caused by noise. It is noted that noise increases the duty cycle (e.g., as denoted by the increase data values).

FIG. 11B includes graph 1190 which illustrates an exemplary signal from a finger in proximity to a sensing capacitor. Graph 1190 includes horizontal axis 1194 representing packet number (e.g., 24 packets/second) and vertical axis 1192 representing data. Portions of the signal 1196 and 1199 correspond to no object (e.g., finger) in proximity of a capacitive sensor. Portion of the signal 1198 corresponds to an object (e.g., finger) being in proximity to the capacitive sensor. The presence of an object increases the capacitance and therefore reduces the duty cycle of the signal from the capacitive sensing system. In one embodiment, such a signal may be from a capacitive sensor with a 2 mm plastic overlay.

FIGS. 12A-B are graphs of exemplary signals of an exemplary capacitive sensing system, in accordance with an embodiment of the invention. FIG. 12A includes graph 1200 which illustrates a signal from a finger and noise. Graph 1200 includes horizontal axis 1204 representing packet number (e.g., 24 packets/second) and vertical axis 1202 representing data. Signal portion 1206 corresponds to a decrease in duty cycle (e.g., 50 kHz) caused by the presence of an object (e.g., finger) in proximity to the capacitive sensor. Signal portion 1208 corresponds to noise and an increase in duty cycle (e.g., 300 kHz). Signal portions 1206 and 1208 reflect the asymmetric responses to noise and finger of embodiments of the present invention. In one embodiment, the asymmetric response allows noise to be filtered out by a software filter updating the baseline. Signal portions 1210 and 1212 correspond to increases in duty cycle as there is no object in proximity to a capacitive sensor.

FIG. 12B includes graph 1250 which illustrates the effect of electrostatic discharge (ESD). Graph 1200 includes horizontal axis 1254 representing packet number (e.g., 24 packets/second) and vertical axis 1252 representing data. Signal portion 1258 corresponds to an increase in duty cycle caused by the ESD. Signal portion 1256 corresponds to the decrease in duty signal caused by the presence of a finger in proximity to the capacitive sensor. It is noted that FIGS. 11A-B and 12A-B illustrate the asymmetrical response to noise and a finger of embodiments of the present invention.

Figure 13:
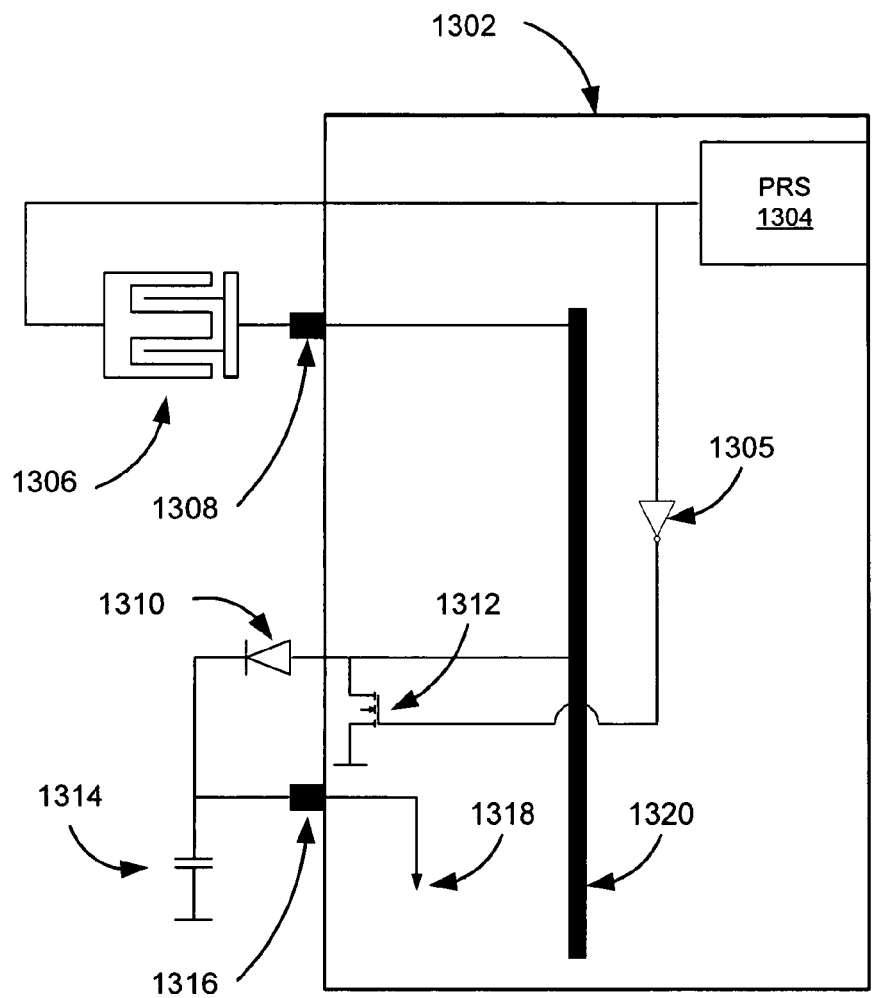
FIG. 13 is a block diagram of an exemplary sensor configuration, in accordance with an embodiment of the invention.

FIG. 13 is a block diagram of an exemplary sensor configuration, in accordance with an embodiment of the invention. Sensor configuration 1300 includes processing device 1302, pseudo-random sequencer 1304, inverter 1305, capacitive sensor 1306, pins 1308, diode 1310, switch 1312, filter capacitive 1314, pin 1316, comparator feed 1318, and analog bus 1320. Sensor configuration 1300 operates in a substantially similar manner as described herein. Sensor configuration 1300 illustrates a connection of the shield electrode to the pins 1308 and 1316 coupled to sensor 1306 and filter capacitor 1314. In one embodiment, switch 1312 is an open drain low switch.

Figure 14:
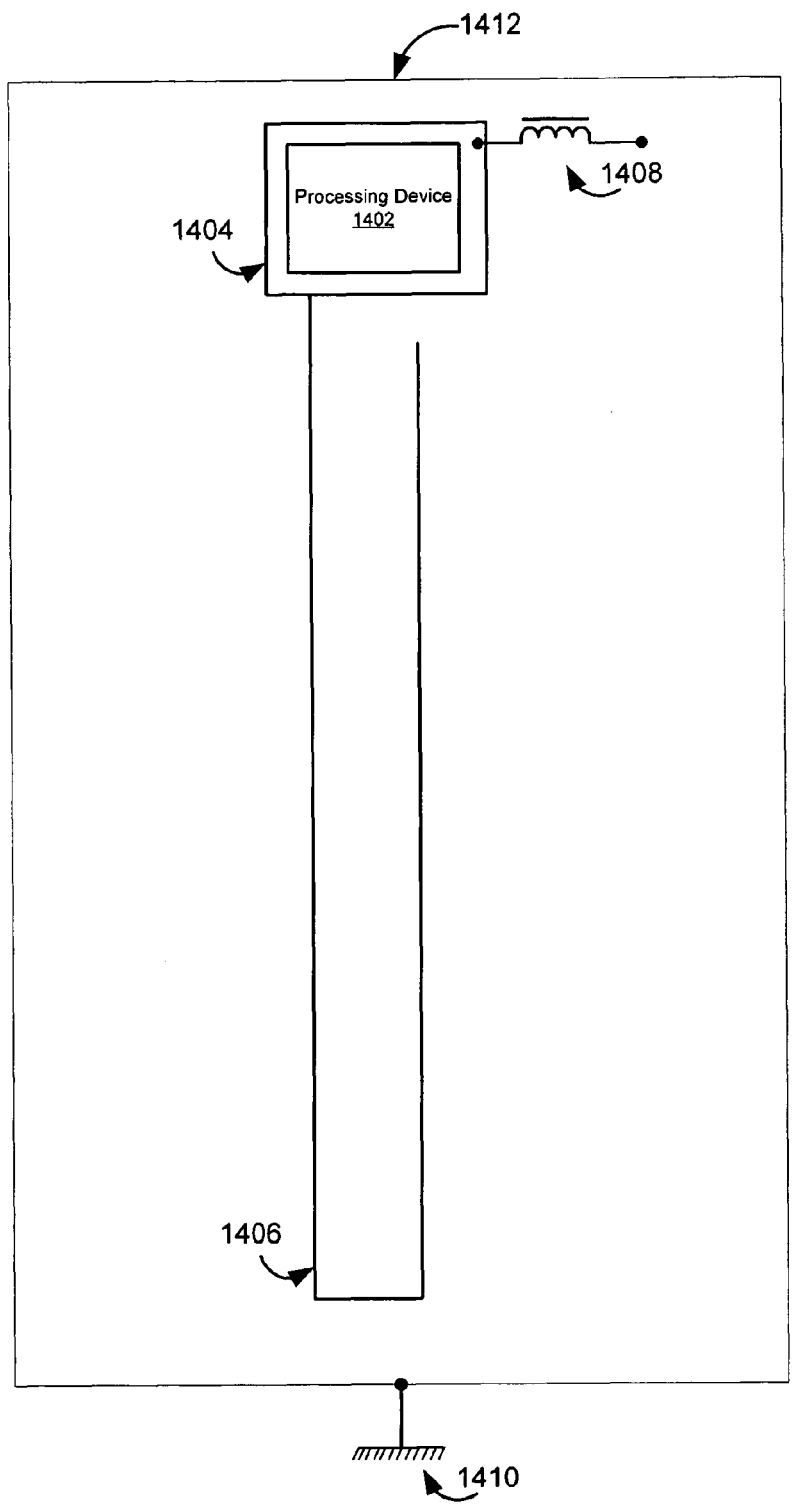
FIG. 14 is a block diagram of an exemplary PCB coupling, in accordance with an embodiment of the invention.

FIG. 14 is a block diagram of an exemplary PCB coupling, in accordance with an embodiment of the invention. Exemplary PCB coupling 1400 includes metal body 1412, processing device 1402, PCB 1404, proximity sensor wires 1406, inductor 1408, and earth ground 1410. Inductor 1408 couples PCB 1404 to metal body 1412 thereby providing higher sensitivity (e.g., 50%) and a galvanic board to metal coupling. This higher sensitivity provides for increased sensitivity proximity sensing. Electromagnetic interference (EMI) radiation can also be decreased.

Figure 15:
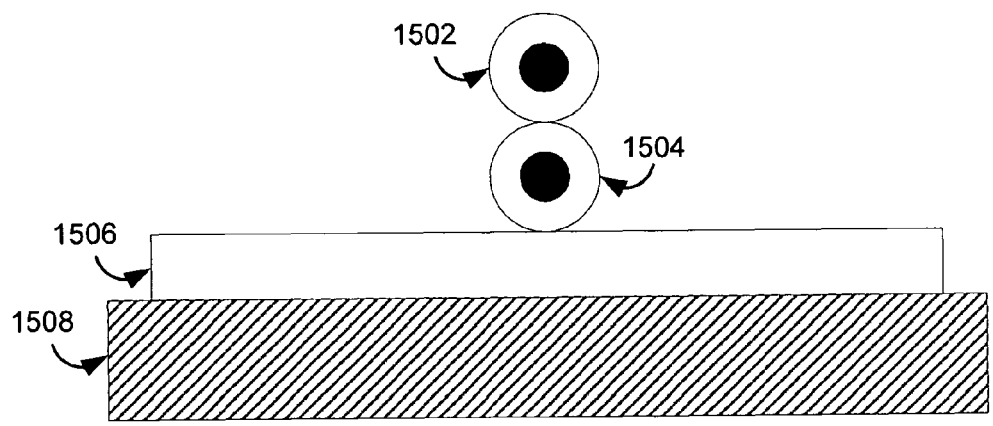
FIG. 15 is a block diagram of an exemplary wire configuration, in accordance with an embodiment of the invention.

FIG. 15 is a block diagram of an exemplary wire configuration, in accordance with an embodiment of the invention. Wire configuration 1500 includes metal body 1508, isolation 1506, transmit wire 1504, and receive wire 1502. Transmit wire 1504 in conjunction with various aspects of embodiments of the present invention may function as a shield electrode thereby removing the need for additional isolation between the wires 1502-1504 and the metal body 1508. It is appreciated that the isolation thickness between a shield electrode and a metal body influences the sensitivity. For example, sensitivity may increase linearly at isolation thickness increases in the range of 1 mm-5 mm. When the thickness exceeds 5 mm, sensitivity dependence on isolation thickness may become very low.

Figure 16:
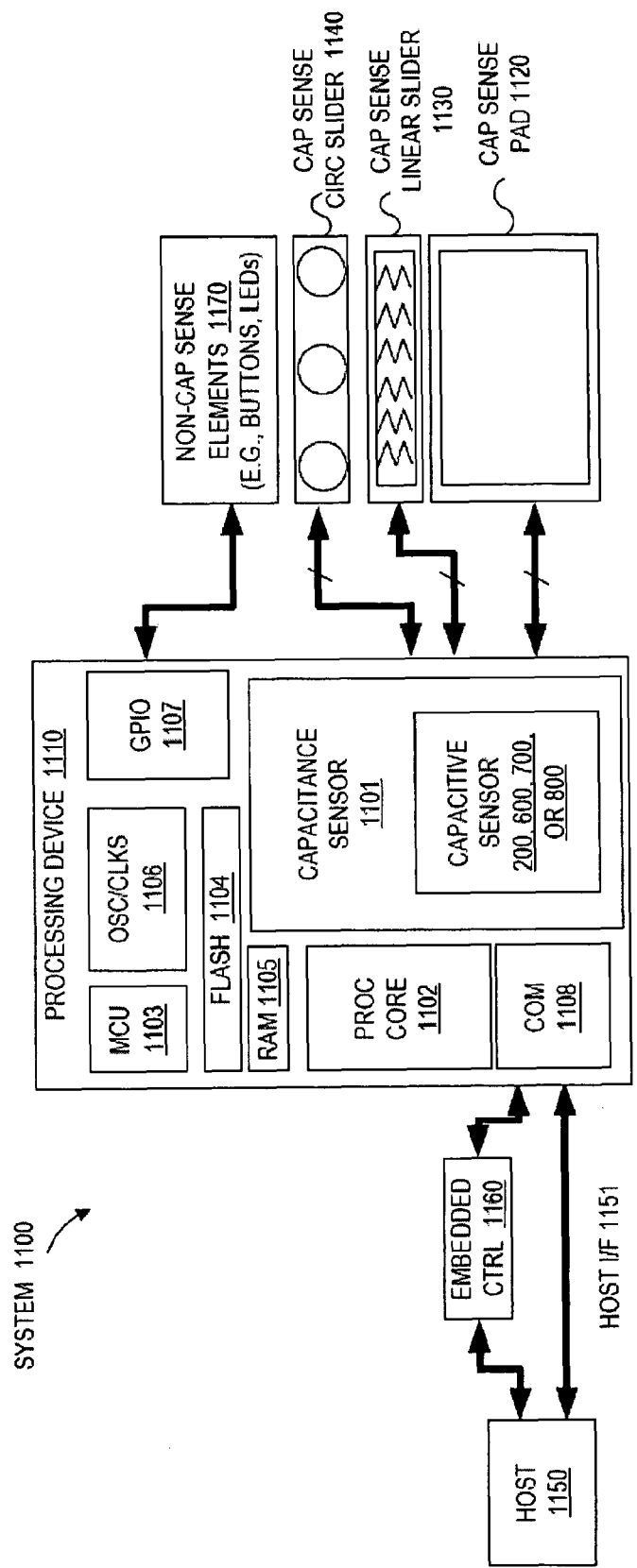
FIG. 16 is a functional block diagram illustrating a demonstrative processing system for implementing a capacitive sense user interface, in accordance with an embodiment of the invention.

FIG. 16 is a functional block diagram illustrating a demonstrative system 1100 for implementing a capacitive sense user interface, in accordance with an embodiment of the invention. The illustrated embodiment of system 1100 includes a processing device 1110, a capacitive sense pad 1120, a capacitive sense linear slider 1130, a capacitive sense radial slider 1140, a host processor 1150, an embedded controller 1160, and non-capacitance sensor elements 1170. Processing device 1110 may include analog and/or digital general purpose input/output ("GPID") ports 1107. GPIO ports 1107 may be programmable. GPID ports 1107 may be coupled to a Programmable Interconnect and Logic ("PIL"), which acts as an interconnect between GPID ports 1107 and a digital block array of processing device 1110 (not illustrated). The digital block array may be configured to implement a variety of digital logic circuits (e.g., DAC, digital filters, digital control systems, etc.) using, in one embodiment, configurable user modules ("UMs"). The digital block array may be coupled to a system bus. Processing device 1110 may also include memory, such as random access memory (RAM) 1105 and program flash 1104. RAM 1105 may be static RAM ("SRAM"), and program flash 1104 may be a non-volatile storage, which may be used to store firmware. Processing device 1110 may also include a memory controller unit ("MCU") 1103 coupled to memory and the processing core 1102.

Processing device 1110 may also include an analog block array (not illustrated). The analog block array is also coupled to the system bus. The analog block array also may be configured to implement a variety of analog circuits (e.g., ADC, analog filters, etc.) using, in one embodiment, configurable UMs. The analog block array may also be coupled to the GPIO 1107.

As illustrated, capacitance sensor 1101, which includes an implementation of capacitance sensor 200, 600, 700, or 800 may be integrated into processing device 1110. Capacitance sensor 1101 may include analog I/O for coupling to an external component, such as capacitive sense pad 1120, capacitive sense linear slider 1130, capacitive sense radial slider 1140, and/or other capacitive sense devices. Capacitive sense pad 1120, capacitive sense linear slider 1130, and/or capacitive sense radial slider 1140 may each include one or more sensing capacitors Cx to implement the individual capacitive sense buttons therein.

Processing device 1110 may include internal oscillator/clocks 1106 and communication block 1108. The oscillator/clocks block 1106 provides clock signals to one or more of the components of processing device 1110. Communication block 1108 may be used to communicate with an external component, such as a host processor 1150, via host interface (I/F) line 1151. Alternatively, processing device 1110 may also be coupled to embedded controller 1160 to communicate with the external components, such as host 1150. Interfacing to the host 1150 can be through various methods. In one exemplary embodiment, interfacing with the host 1150 may be done using a standard PS/2 interface to connect to embedded controller 1160, which in turn sends data to the host 1150 via low pin count (LPC) interface. In some instances, it may be beneficial for processing device 1110 to do both touch-sensor pad and keyboard control operations, thereby freeing up the embedded controller 1160 for other housekeeping functions. In another exemplary embodiment, interfacing may be done using a universal serial bus (USB) interface directly coupled to host 1150 via host interface line 1151. Alternatively, processing device 1110 may communicate to external components, such as host 1150 using industry standard interfaces, such as USB, PS/2, inter-integrated circuit (I2C) bus, or system packet interfaces (SPI). Host 1150 and/or embedded controller 1160 may be coupled to processing device 1110 with a ribbon or flex cable from an assembly, which houses the sensing device and processing device.

In one embodiment, processing device 1110 is configured to communicate with embedded controller 1160 or host 1150 to send and/or receive data. The data may be a command or alternatively a signal. In an exemplary embodiment, system 1100 may operate in both standard-mouse compatible and enhanced modes. The standard-mouse compatible mode utilizes the HID class drivers already built into the Operating System (OS) software of host 1150. These drivers enable processing device 1110 and sensing device to operate as a standard cursor control user interface device, such as a two-button PS/2 mouse. The enhanced mode may enable additional features such as scrolling (reporting absolute position) or disabling the sensing device, such as when a mouse is plugged into the notebook. Alternatively, processing device 1110 may be configured to communicate with embedded controller 1160 or host 1150, using non-OS drivers, such as dedicated touch-sensor pad drivers, or other drivers known by those of ordinary skill in the art.

Processing device 1110 may reside on a common carrier substrate such as, for example, an integrated circuit (IC) die substrate, a multi-chip module substrate, or the like. Alternatively, the components of processing device 1110 may be one or more separate integrated circuits and/or discrete components. In one exemplary embodiment, processing device 1110 may be a Programmable System on a Chip (PSOC™) processing device, manufactured by Cypress Semiconductor Corporation, San Jose, Calif. Alternatively, processing device 1110 may be one or more other processing devices known by those of ordinary skill in the art, such as a microprocessor or central processing unit, a controller, special-purpose processor, digital signal processor ("DSP"), an application specific integrated circuit ("ASIC"), a field programmable gate array ("FPGA"), or the like. In an alternative embodiment, for example, processing device 1110 may be a network processor having multiple processors including a core unit and multiple microengines. Additionally, processing device 1110 may include any combination of general-purpose processing device(s) and special-purpose processing device(s).

Capacitance sensor 1101 may be integrated into the IC of processing device 1110, or alternatively, in a separate IC. Descriptions of capacitance sensor 1101 may be generated and compiled for incorporation into other integrated circuits. For example, behavioral level code describing capacitance sensor 1101, or portions thereof, may be generated using a hardware descriptive language, such as VHDL or Verilog, and stored to a machine-accessible medium (e.g., CD-ROM, hard disk, floppy disk, etc.). Furthermore, the behavioral level code can be compiled into register transfer level ("RTL") code, a netlist, or even a circuit layout and stored to a machine-accessible medium. The behavioral level code, the RTL code, the netlist, and the circuit layout all represent various levels of abstraction to describe capacitance sensor 1101.

In one embodiment, electronic system 1100 may be used in a notebook computer. Alternatively, system 1100 may be used in other applications, such as a mobile handset, a personal data assistant (PDA), a keyboard, a television, a remote control, a monitor, a handheld multi-media device, a handheld video player, a handheld gaming device, or a control panel.

The processes explained above are described in terms of computer software and hardware. The techniques described may constitute machine-executable instructions embodied within a machine (e.g., computer) readable medium, that when executed by a machine will cause the machine to perform the operations described. Additionally, the processes may be embodied within hardware, such as an application specific integrated circuit ("ASIC") or the like.

A machine-accessible medium includes any mechanism that provides (e.g., stores) information in a form accessible by a machine (e.g., a computer, network device, personal digital assistant, manufacturing tool, any device with a set of one or more processors, etc.). For example, a machine-accessible medium includes recordable/non-recordable media (e.g., read only memory (ROM), random access memory (RAM), magnetic disk storage media, optical storage media, flash memory devices, etc.).

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A method comprising:
   charging a sensing capacitor and a modulation capacitor in a first non-overlapping phase;
   discharging the sensing capacitor in a second non-overlapping phase;
   generating a modulation signal in response to accumulated charge on the modulation capacitor, the modulation signal having at least one characteristic;

determining a presence of an object proximate to the sensing capacitor based on the at least one characteristic of the modulation signal.

2. The method of claim 1, wherein in the first non-overlapping phase, the charging capacitor and the modulation capacitor are coupled to the charge source.

3. The method of claim 1, wherein, in the second non-overlapping phase, the sensing capacitor is coupled to a discharge voltage potential while the modulation capacitor is decoupled from the sensing capacitor.

4. The method of claim 1, wherein the generating of the modulation signal comprises:
coupling the modulation capacitor to a comparison circuit; and
comparing a voltage potential across the modulation capacitor to a reference voltage potential.

5. The method of claim 1 wherein the determining the presence of the object proximate to the sensing capacitor comprises:
comparing the characteristic of the modulation signal to a baseline characteristic; and
if the characteristic of the modulation signal differs substantially from the baseline characteristic, determining the presence of the object proximate to the sensing capacitor.

6. The method of claim 1, wherein the characteristic of the modulation signal is a duty cycle.

7. The method of claim 1, wherein the first and second non-overlapping phases are defined by a pseudo-random pulse generator.

8. A method comprising:
responsive to a charging signal, charging a modulation capacitor based on a capacitance of a sensing capacitor;
generating a modulation signal having a characteristic that changes in a first direction in response to a change in capacitance of the sensing capacitor and changes in a second direction in response to noise.

9. The method of claim 8, further comprising discharging the sensing capacitor in response to a discharge signal by coupling the sensing capacitor to a discharge voltage potential, wherein the discharging the sensing capacitor does not affect the charge on the modulation capacitor.

10. The method of claim 9, wherein the charging and discharging of the sensing capacitor is controlled by a pseudo-random signal generator.

11. The method of claim 8, wherein the modulation signal is configured to discharge the modulation capacitor through a discharge circuit in a first state and is configured to allow charging of the modulation capacitor based on the capacitance of the sensing capacitor in a second state.

12. The method of claim 8, wherein the characteristic of the modulation signal is a duty cycle.

13. The method of claim 8, further comprising:
comparing the characteristic of the modulation capacitor to a baseline characteristic; and
determining a presence of a conductive object on the sensing capacitor based on the comparison of the characteristic of the modulation capacitor to the baseline characteristic.

14. The method of claim 8, wherein the conductive object is a finger.

15. The method of claim 8, wherein the sensing capacitor is one capacitor of a plurality of capacitors.

16. The method of claim 8, wherein the sensing capacitor comprises a first drive electrode and second receive electrode, wherein the drive electrode is coupled to a charge voltage and wherein the receive electrode is coupled to the modulation capacitor.

17. An apparatus comprising:
a sensing capacitor alternately coupleable to a charge voltage and a discharge voltage in non-overlapping phases;
a modulation capacitor coupled to the sensing capacitor and to a modulation circuit, the modulation circuit configured to generate a modulation signal based on the charge on the modulation capacitor; and
a detection circuit configured to determine a presence of an object proximate to the sensing capacitor based on a characteristic of the modulation signal.

18. The apparatus of claim 17, wherein the characteristic of the modulating signal is asymmetrically responsive to noise and the presence of the object.

19. The apparatus of claim 17, wherein the sensing capacitor is one of a plurality of capacitor formed by the intersection of at least one electrode disposed along a first axis at a plurality of electrodes disposed along a second axis.

20. The apparatus of claim 17, wherein the sensing capacitor comprises to parallel wires, a first wire coupled to a charging/discharging circuit and a second wire coupled to the modulation capacitor.

* * * * *